(12) United States Patent
Peng et al.

(10) Patent No.: US 11,004,779 B2
(45) Date of Patent: May 11, 2021

(54) SEMICONDUCTOR DEVICE PACKAGE AND A METHOD OF MANUFACTURING THE SAME

(71) Applicant: Advanced Semiconductor Engineering, Inc., Kaohsiung (TW)

(72) Inventors: Po-Shu Peng, Kaohsiung (TW); Cheng-Lin Ho, Kaohsiung (TW); Chih-Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/893,180

(22) Filed: Feb. 9, 2018

(65) Prior Publication Data
US 2019/0252305 A1    Aug. 15, 2019

(51) Int. Cl.
*H01L 23/498*    (2006.01)
*H01L 21/48*    (2006.01)
*H01L 23/00*    (2006.01)

(52) U.S. Cl.
CPC ...... *H01L 23/49827* (2013.01); *H01L 21/486* (2013.01); *H01L 21/4853* (2013.01); *H01L 23/49816* (2013.01); *H01L 24/16* (2013.01); *H01L 2224/16227* (2013.01); *H01L 2224/16235* (2013.01)

(58) Field of Classification Search
CPC ......... H01L 23/49827; H01L 23/49816; H01L 21/486; H01L 21/4853; H01L 2224/16235; H01L 24/16; H01L 2224/16227; H01L 2224/05599; H01L 2224/13147; H01L 2224/13111; H01L 2224/13144; H01L 24/13; H01L 2924/15311; H01L 2224/16238; H01L 23/49822; H01L 21/4857
See application file for complete search history.

(56) References Cited

U.S. PATENT DOCUMENTS

| | | | | |
|---|---|---|---|---|
| 7,061,116 | B2 * | 6/2006 | McCormick | H05K 1/114 257/773 |
| 7,394,159 | B2 * | 7/2008 | Goto | H01L 23/49827 257/737 |
| 7,921,550 | B2 | 4/2011 | Yu | |
| 2007/0132106 | A1 * | 6/2007 | Zhou | H05K 3/4007 257/778 |
| 2016/0133537 | A1 | 5/2016 | Shih et al. | |
| 2016/0133562 | A1 * | 5/2016 | Lee | H01L 23/49822 257/774 |
| 2016/0163578 | A1 * | 6/2016 | Yu | H01L 21/6835 257/738 |
| 2016/0338202 | A1 * | 11/2016 | Park | H01L 23/5389 |

* cited by examiner

*Primary Examiner* — Benjamin Tzu-Hung Liu
(74) *Attorney, Agent, or Firm* — Foley & Lardner LLP

(57) ABSTRACT

A substrate includes a first dielectric layer having a first surface and a second surface opposite to the first surface, a first patterned conductive layer adjacent to the first surface of the first dielectric layer and comprising an interconnection structure, and an interconnection element. The interconnection element extends from the first surface of the first dielectric layer to the second surface of the first dielectric layer and is surrounded by the interconnection structure.

17 Claims, 34 Drawing Sheets

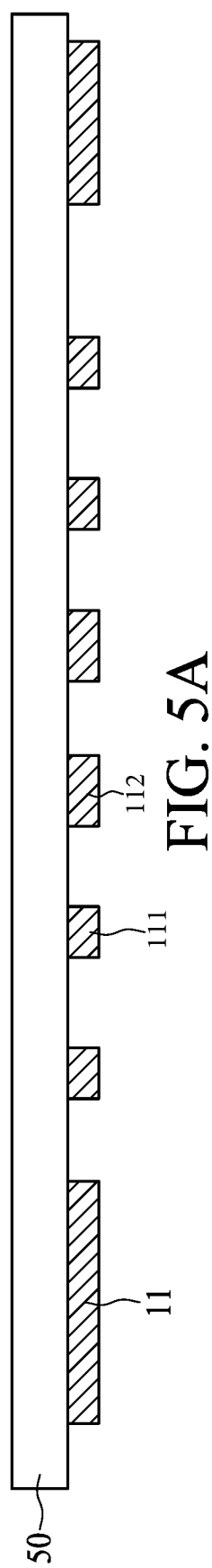

SEMICONDUCTOR DEVICE PACKAGE AND A METHOD OF MANUFACTURING THE SAME

BACKGROUND

1. Technical Field

The present disclosure relates to a semiconductor device package, and to a substrate including a dielectric layer, a patterned conductive layer including an interconnection structure, and an interconnection element surrounded by the interconnection structure.

2. Description of the Related Art

A semiconductor device package may include an interconnection element (e.g. a conductive via) for electrical connection between two or more conductive layers separated or insulated by an insulation/dielectric layer. However, such a structure may be problematic in certain regards.

SUMMARY

In some embodiments, according to one aspect, a substrate includes a first dielectric layer having a first surface and a second surface opposite to the first surface, a first patterned conductive layer adjacent to the first surface of the first dielectric layer and including an interconnection structure, and an interconnection element. The interconnection element extends from the first surface of the first dielectric layer to the second surface of the first dielectric layer and is surrounded by the interconnection structure.

In some embodiments, according to another aspect, a substrate includes a dielectric layer having a first surface and a second surface opposite to the first surface, a first patterned conductive layer adjacent to the first surface of the dielectric layer and including an interconnection structure, and an interconnection element having a first surface and a second surface and tapering from the first surface to the second surface. The interconnection element extends from the first surface of the dielectric layer to the second surface of the dielectric layer and is surrounded by the interconnection structure.

In some embodiments, according to another aspect, a substrate includes a first dielectric layer having a first surface and a second surface opposite to the first surface, a first patterned conductive layer adjacent to the first surface of the first dielectric layer and including an interconnection structure, a second patterned conductive layer adjacent to the second surface of the first dielectric layer, and an interconnection element electrically connecting the first patterned conductive layer to the second patterned conductive layer and surrounded by the interconnection structure. The interconnection element and at least a portion of the second patterned conductive layer are formed as a monolithic structure.

In some embodiments, according to another aspect, a semiconductor device package includes a substrate and semiconductor device. The substrate includes a dielectric layer having a first surface and a second surface opposite to the first surface, a first patterned conductive layer adjacent to the first surface of the dielectric layer and including an interconnection structure, and an interconnection element having a first surface and a second surface and tapering from the first surface to the second surface. The interconnection element extends from the first surface of the dielectric layer to the second surface of the dielectric layer and is surrounded by the interconnection structure. The semiconductor device is disposed on the substrate and electrically connected to the interconnection structure.

In some embodiments, according to another aspect, a method is disclosed for manufacturing a substrate. The method includes: providing a carrier and a conductive layer; patterning the conductive layer to form a patterned conductive layer including a conductive pad, the conductive pad including an interconnection structure that defines an opening; forming a first dielectric layer on the patterned conductive layer, the first dielectric layer having a first surface and a second surface opposite to the first surface; forming an opening in the first dielectric layer, the opening of the conductive pad and the opening of the first dielectric layer being continuous; forming an interconnection element in the opening of the first dielectric layer such that interconnection element extends to the opening of the interconnection structure and is surrounded by the interconnection structure; and removing the carrier.

BRIEF DESCRIPTION OF THE DRAWINGS

FIG. 5A illustrates a method of manufacturing a substrate according to some embodiments of the present disclosure.

DETAILED DESCRIPTION

Figure 1A:
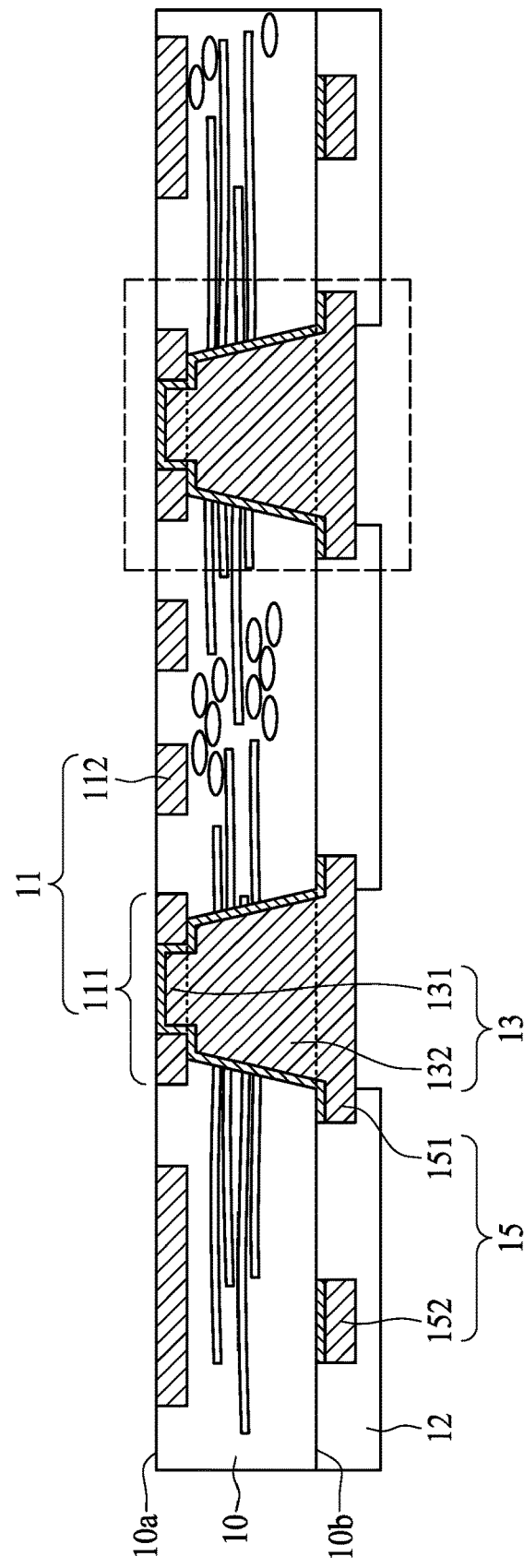
FIG. 1A illustrates a cross-sectional view of a substrate according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1A is a cross-sectional view of a substrate 1 in accordance with some embodiments of the present disclosure. The substrate 1 includes a dielectric layer 10, a patterned conductive layer 11, a dielectric layer 12, an interconnection element 13, and a patterned conductive layer 15.

The dielectric layer 10 has a surface 10a and a surface 10b opposite to the surface 10a. The dielectric layer 10 includes a resin layer and a fiberglass.

The patterned conductive layer 11 is adjacent to the surface 10a of the dielectric layer 10. The patterned conductive layer 11 includes a conductive pad 111 and a conductive trace 112 adjacent to the conductive pad 111. The conductive pad 111 includes an interconnection structure, such as a ring/annular structure. The conductive pad 111 and the conductive trace 112 of the patterned conductive layer 11 are embedded in the dielectric layer 10.

The patterned conductive layer 15 is adjacent to the surface 10b of the dielectric layer 10. The patterned conductive layer 15 includes a conductive pad 151 and a conductive trace 152 adjacent to the conductive pad 151. The conductive pad 151 and the conductive trace 152 of the patterned conductive layer 15 are disposed on the surface 10b of the dielectric layer 10. In some embodiments, a width of the conductive trace 112 of the patterned conductive layer 11 is less than a width of the conductive trace 152 of the patterned conductive layer 15 (e.g. a ratio of the width of the conductive trace 112 to the width of the conductive trace 152 is about 0.9 or less, about 0.8 or less, or about 0.7 or less). A length of the conductive trace 112 of the patterned conductive layer 11 is less than a length of the conductive trace 152 of the patterned conductive layer 15 (e.g. a ratio of the length of the conductive trace 112 to the length of the conductive trace 152 is about 0.9 or less, about 0.8 or less, or about 0.7 or less).

The interconnection element 13 includes a portion 131 and a portion 132. The interconnection element 13 extends at least from the surface 10a of the dielectric layer 10 to the surface 10b of the dielectric layer 10. The portion 131 of the interconnection element 13 is surrounded by the ring/annular structure of the conductive pad 111. The portion 132 of the interconnection element 13 is covered by the conductive pad 111. The interconnection element 13 electrically connects the conductive pad 111 of the patterned conductive layer 11 to the conductive pad 151 of the patterned conductive layer 15. The interconnection element 13 may be a conductive via. The interconnection element 13 may be, or may include, copper, aluminum, gold, another metal, a metal alloy, another suitable conductive material, or a combination thereof. The material of the interconnection element 13 may be the same as or different from the material of the patterned conductive layer 11 or 15.

The portion 131 has a cylinder-like structure. The portion 132 has a conic-like structure. In some embodiments, the portion 131 has a cylindrical structure. The portion 131 may be a solid cylindrical post, a solid square post, or a solid post with another suitable polygonal or non-polygonal shape. The portion 132 has a conic structure or a volcanic cone structure. The portion 131 is embedded in the ring/annular structure of the conductive pad 111.

The dielectric layer 12 is disposed on the surface 10b of the dielectric layer 10. The dielectric layer 12 defines an opening to partially expose the conductive pad 151. The conductive trace 152 is covered by the dielectric layer 12.

Figure 1B:
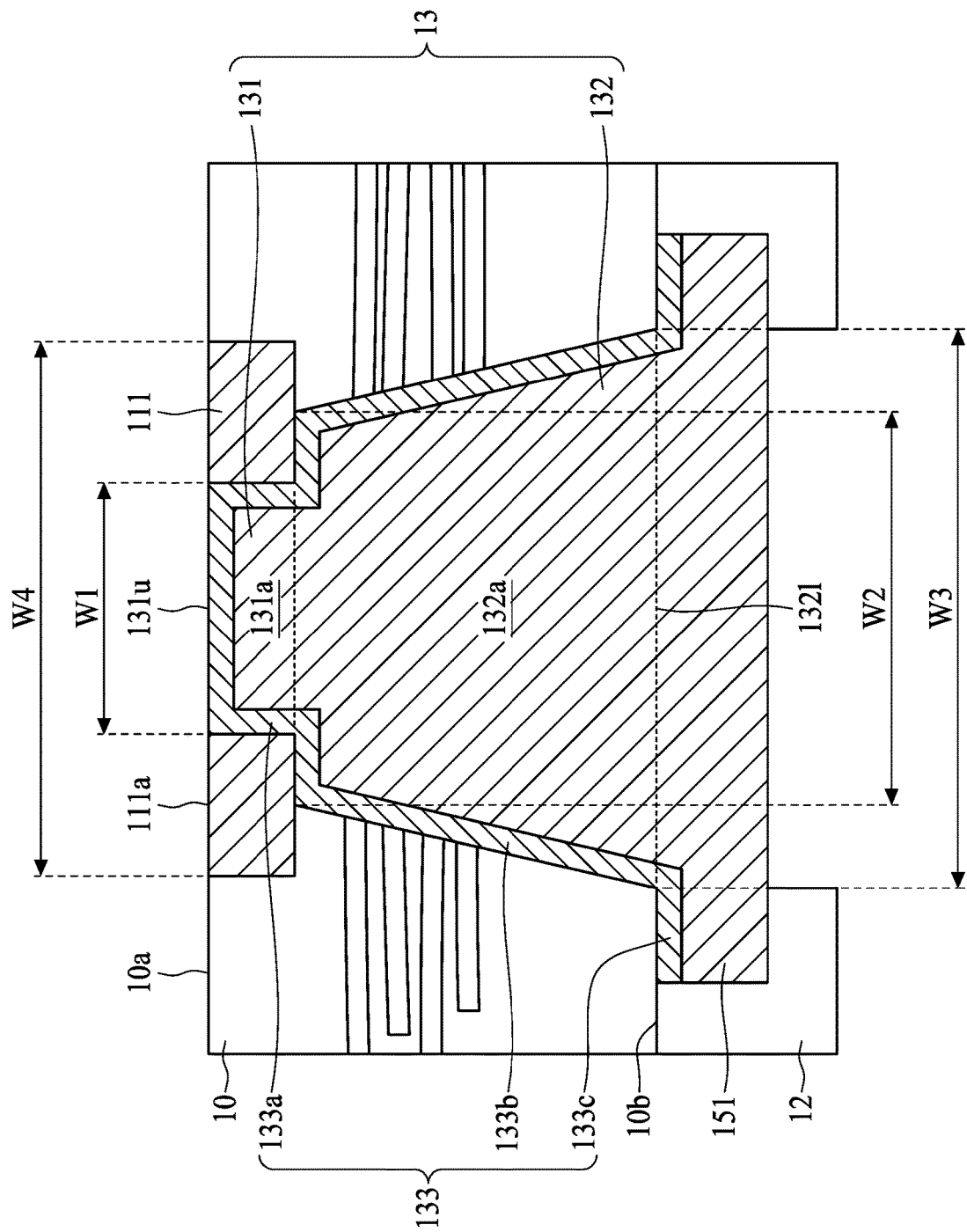
FIG. 1B illustrates a cross-sectional view of an interconnection element according to some embodiments of the present disclosure.

FIG. 1B is a cross-sectional view of the interconnection element 13 according to some embodiments of the present disclosure, and shows an enlarged view of a region delimited by a dashed line in FIG. 1A.

The conductive pad 111 has a surface 111a. The surface 111a of the conductive pad 111 and the surface 10a of the dielectric layer 10 are substantially coplanar. A surface 131u of the portion 131 and the surface 10a of the dielectric layer 10 are substantially coplanar. The conductive pad 111 has a width W4 (e.g., a diameter or a width).

The substrate 1 also includes a patterned conductive layer 133, as shown in FIG. 1B. The patterned conductive layer 133 includes a portion 133a, a portion 133b, and a portion 133c. The portion 131 of the interconnection element 13 includes a portion 131a and the portion 133a of the patterned conductive layer 133. The portion 132 of the interconnection element 13 includes a portion 132a and the portion 133b of the patterned conductive layer 133. The portion 133c of the patterned conductive layer 133 contacts the conductive pad 151. The patterned conductive layer 133 is a seed layer. The patterned conductive layer 133 is in contact with the dielectric layer 10 and the ring/annular structure of the patterned conductive layer 11. The surface 131u of the portion 131 may be a surface of the portion 133a of the patterned conductive layer 133.

The interconnection element 13 has the surface 131u and a surface 132l opposite to the surface 131u. The surface 132l is a surface of the portion 132 of the interconnection element 13, and the surface 132l and the surface 10b of the dielectric layer 10 are substantially coplanar. The interconnection element 13 tapers from the surface 132l to the surface 131u (e.g. a width of the interconnection element 13 becomes smaller (e.g. progressively smaller) going from the surface 132l to the surface 131u). A width W1 of the portion 131 (e.g. a maximum width of the portion 131) is less than a width W2 of the portion 132 (e.g. a minimum width of the portion 132). For example, a ratio of the width W1 to the width W2 may be about 0.9 or less, about 0.8 or less, or about 0.7 or less. The width W2 of the portion 132 is less than a width W3 of the portion 132 (e.g. a maximum width of the portion 132) of the interconnection element 13 The portion 132 tapers from a lower surface of the portion 132 to an upper surface of the portion 132. The width W4 of the conductive pad 111 is greater than or equal to the width W2 of the portion 132 of the interconnection element 13. For example, a ratio of the width W2 to the width W4 may be about 0.9 or less, about 0.8 or less, or about 0.7 or less.

The size (e.g. length or width) of the conductive pad 111 may be flexibly specified. The width W4 of the conductive pad 111 may be less than or equal to a width W3 of the portion 132. For example, a ratio of the width W4 to the width W3 may be about 0.9 or less, about 0.8 or less, or about 0.7 or less. The width W4 of the conductive pad 111 is in a range from approximately 75 micrometers (μm) to approximately 80 μm.

According to one or more embodiments, the portion 131 of the interconnection element 13 is solidly embedded in the ring/annular structure of the conductive pad 111. Since the interconnection element 13 is substantially surrounded in three dimensions by the conductive pad 111, the stress at an interface between the interconnection element 13 and the conductive pad 111 is mitigated. A crack forming at the interface can be effectively avoided.

Figure 1C:
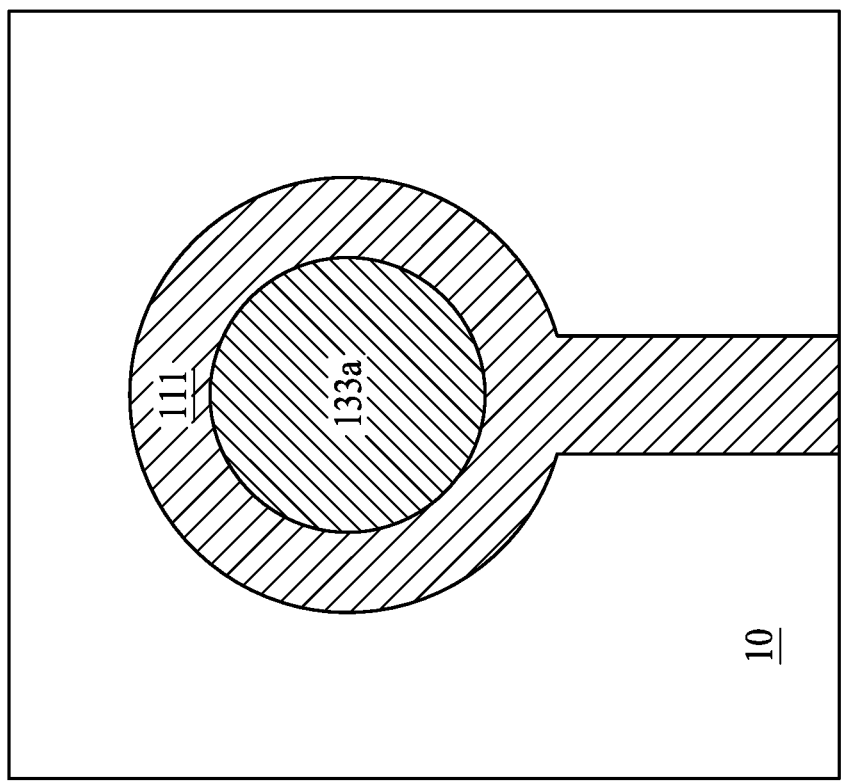
FIG. 1C illustrates a top view of a substrate according to some embodiments of the present disclosure.

FIG. 1C is a top view of the substrate 1 according to some embodiments of the present disclosure. The ring/annular structure of the conductive pad 111 in the dielectric layer 10 surrounds the portion 131 (including the portion 131a and the portion 133a of the patterned conductive layer 133) of the interconnection element 13. The shape of the conductive pad 111 or the interconnection element 13 may be set according to design specifications. The shape of the conductive pad 111 may be a circle or a polygon. The shape of the ring/annular structure of the conductive pad 111 may be a circle or a polygon.

Figure 1D:
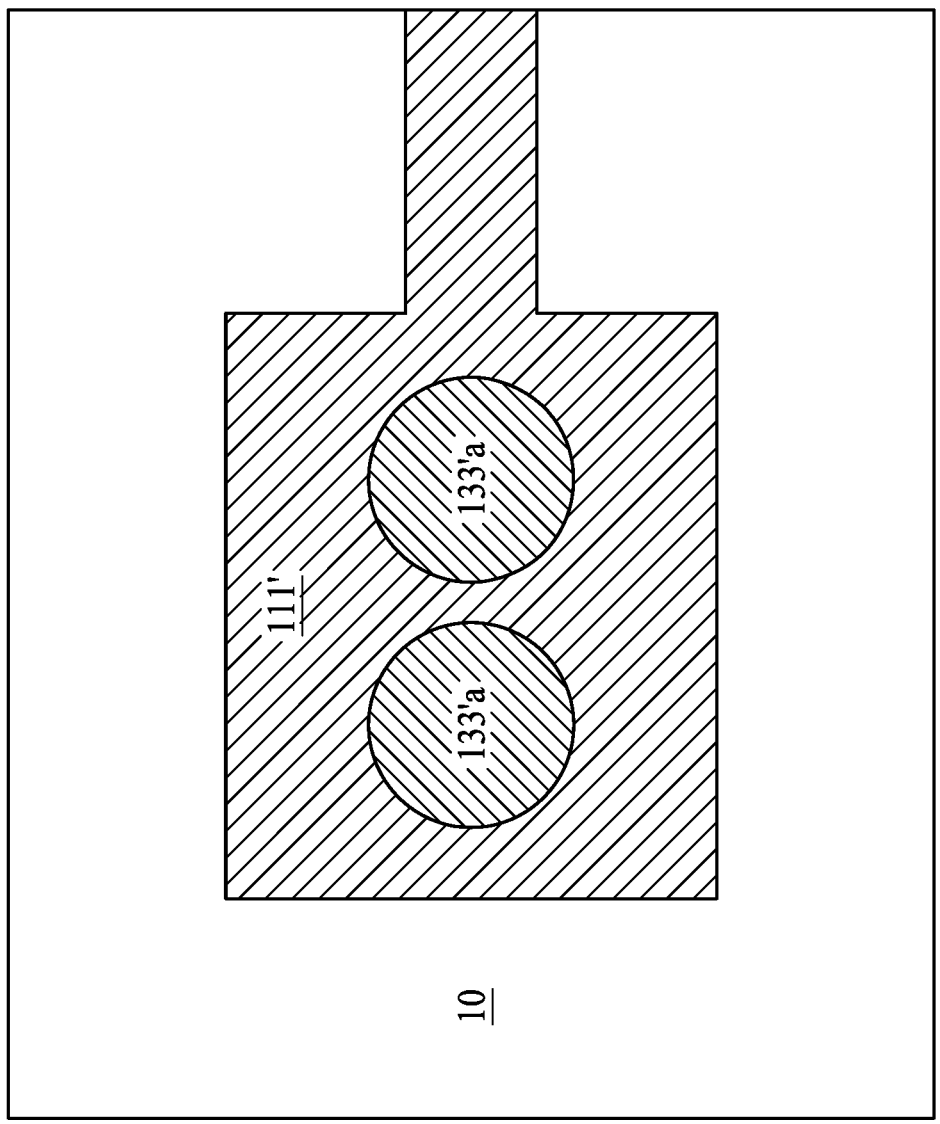
FIG. 1D illustrates a top view of a substrate according to some embodiments of the present disclosure.

FIG. 1D is a top view of a substrate according to some embodiments of the present disclosure. The substrate of FIG. 1D is similar to the substrate 1 of FIG. 1C, except that it includes an interconnection element 13' including a portion 131' (not shown in FIG. 1D) of the interconnection element 13', the portion 131' including two portions 131'a (not shown in FIG. 1D), and two portions 133'a of a patterned conductive layer 133' of the interconnection element 13'. The two portions 131'a may be respectively disposed inside the two portions 133'a. The two portions 133'a of the portion 131' of the interconnection element 13' are surrounded by a ring/annular structure of a conductive pad 111'. The substrate of FIG. 1D provides a solid connection between the conductive pad 111' and the interconnection element 13'.

Figure 1E:
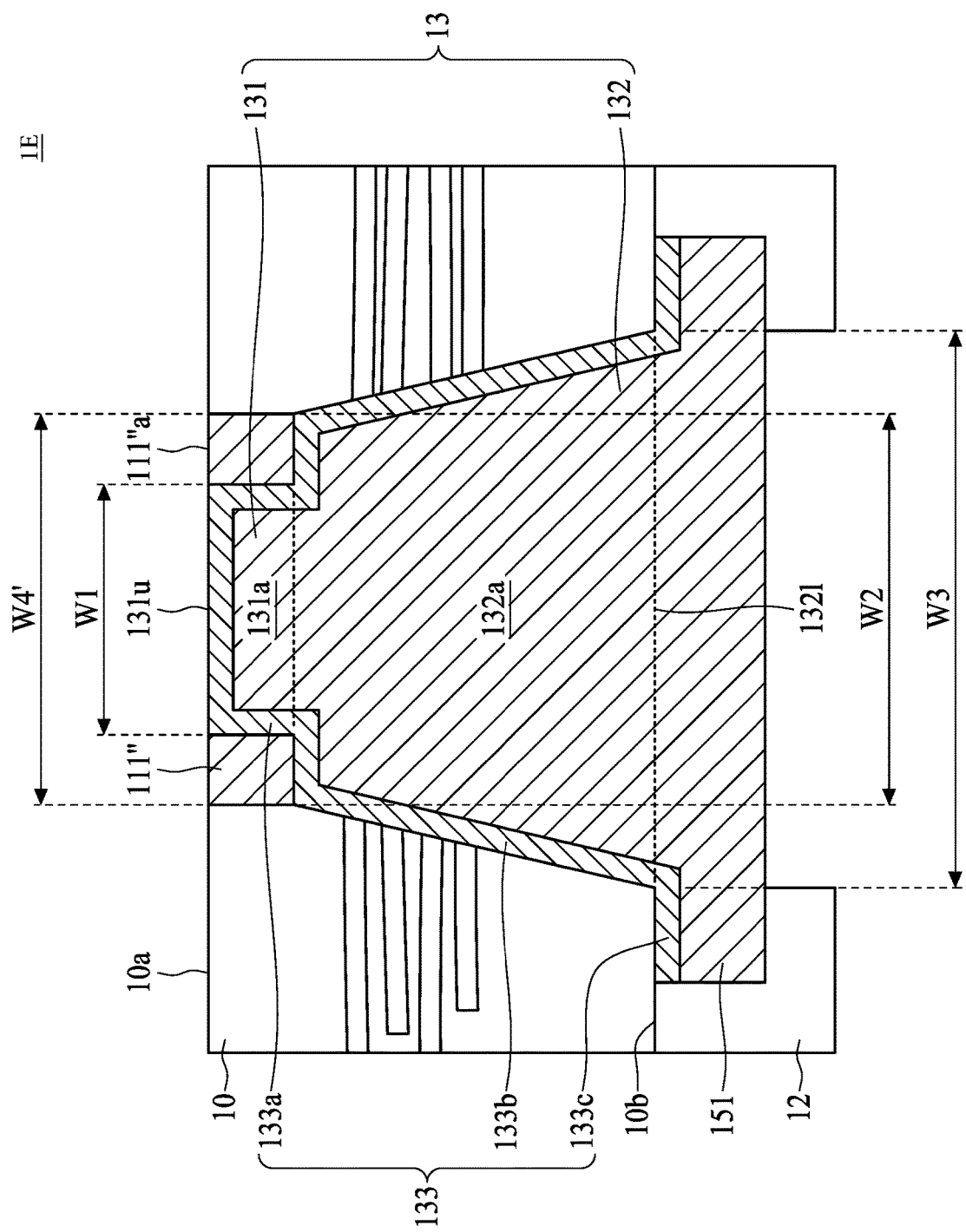
FIG. 1E illustrates a cross-sectional view of an interconnection element according to some embodiments of the present disclosure.

FIG. 1E is a cross-sectional view of the interconnection element 13 of a substrate 1E according to some embodiments of the present disclosure. The substrate 1E of FIG. 1E is similar to the substrate 1 of FIG. 1B, except that a width W4' of a conductive pad 111" is substantially equal to the width W2 of the portion 132. The width W4' of the conductive pad 111" is less than the width W3 of the portion 132. For example, a ratio of the width W4' to the width W3 may be about 0.9 or less, about 0.8 or less, or about 0.7 or less. The width W4' of the conductive pad 111" is in a range from approximately 25 μm to approximately 30 With this configuration, the surface density of the patterned conductive layer 11 can be increased.

Figure 1F:
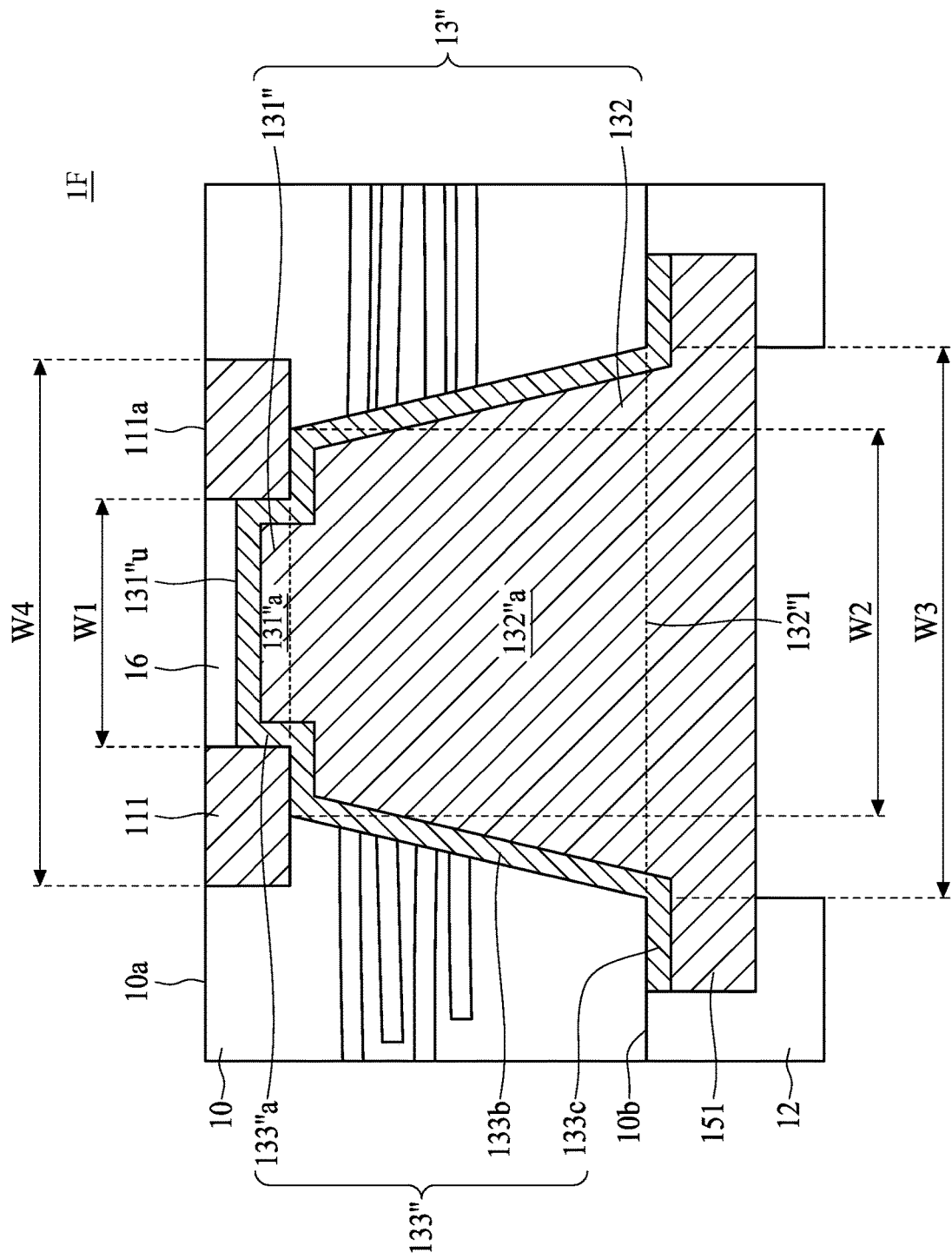
FIG. 1F illustrates a cross-sectional view of an interconnection element according to some embodiments of the present disclosure.

FIG. 1F is a cross-sectional view of an interconnection element 13" of a substrate 1F according to some embodiments of the present disclosure. The substrate 1F of FIG. 1F is similar to the substrate 1 of FIG. 1B, except that a dielectric layer 16 is disposed on a portion 131" of the interconnection element 13" and surrounded by the ring/annular structure of the conductive pad 111. The surface 10a of the dielectric layer 10 and an upper surface of the dielectric layer 16 are substantially coplanar. The surface 10a of the dielectric layer 10 is higher than a surface 131"u of the portion 131". The dielectric layer 16 covers the interconnection element 13". The material of the dielectric layer 16 may be the same as the material of the dielectric layer 10, or may be different from the material of the dielectric layer 10.

Figure 1G:
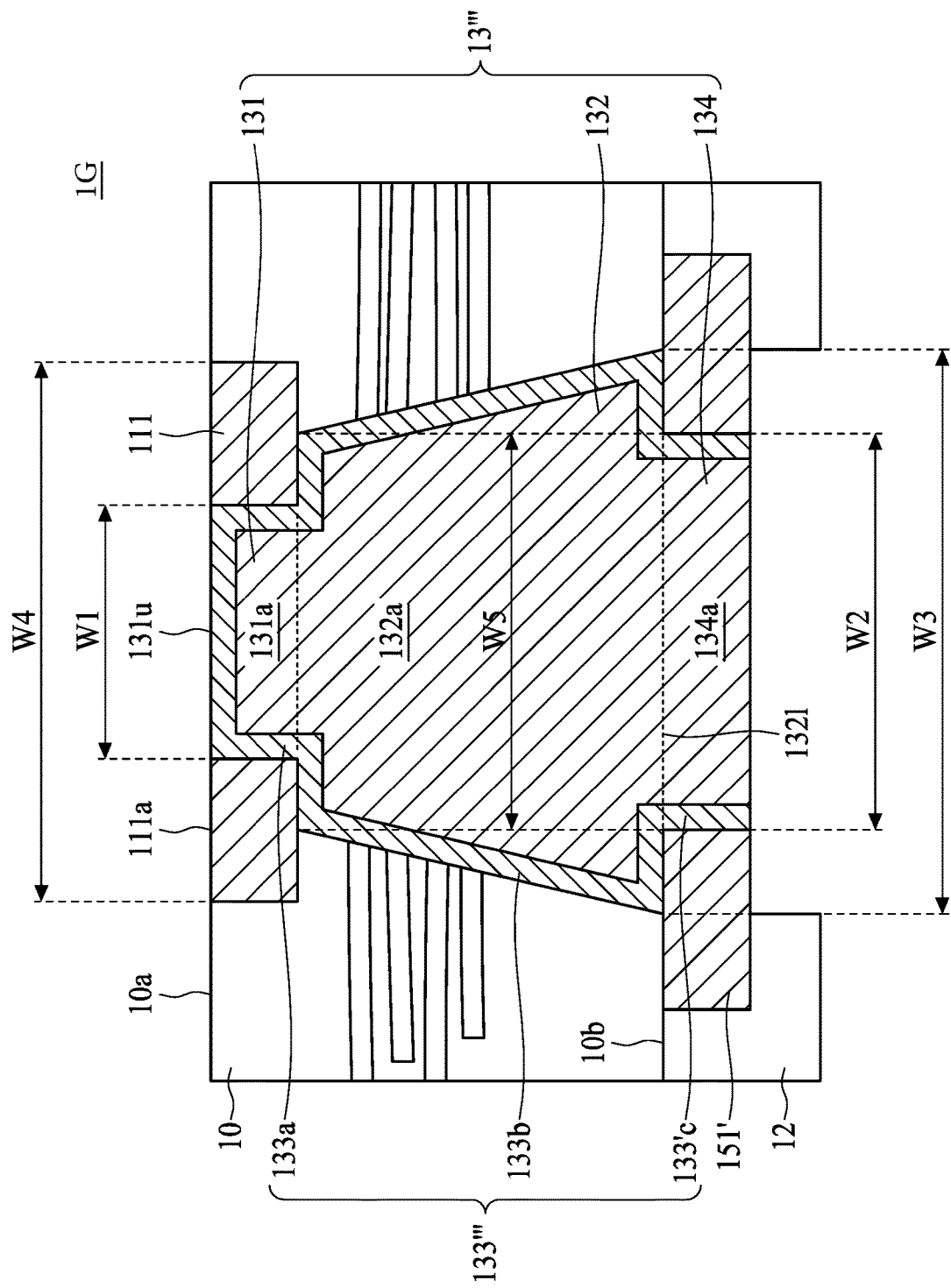
FIG. 1G illustrates a cross-sectional view of an interconnection element according to some embodiments of the present disclosure.

FIG. 1G is a cross-sectional view of an interconnection element 13''' of a substrate 1G according to some embodiments of the present disclosure. The substrate 1G of FIG. 1G is similar to the substrate 1 of FIG. 1B, except that the interconnection element 13''' further includes a portion 134 surrounded by a ring/annular structure of a conductive pad 151', and a patterned conductive layer 133''' includes portions 133a, 133b, and 133'c. The portion 134 includes a portion 134a and the portion 133'c of the patterned conductive layer 133'''. The portion 134 has a cylindrical structure. The portion 134 may be a cylindrical post, a square post, or a post with another suitable polygonal or non-polygonal shape. The portion 134 has a width W5. The width W5 of the portion 134 may be less than, substantially equal to, or greater than the width W2 of the portion 132.

Figure 1H:
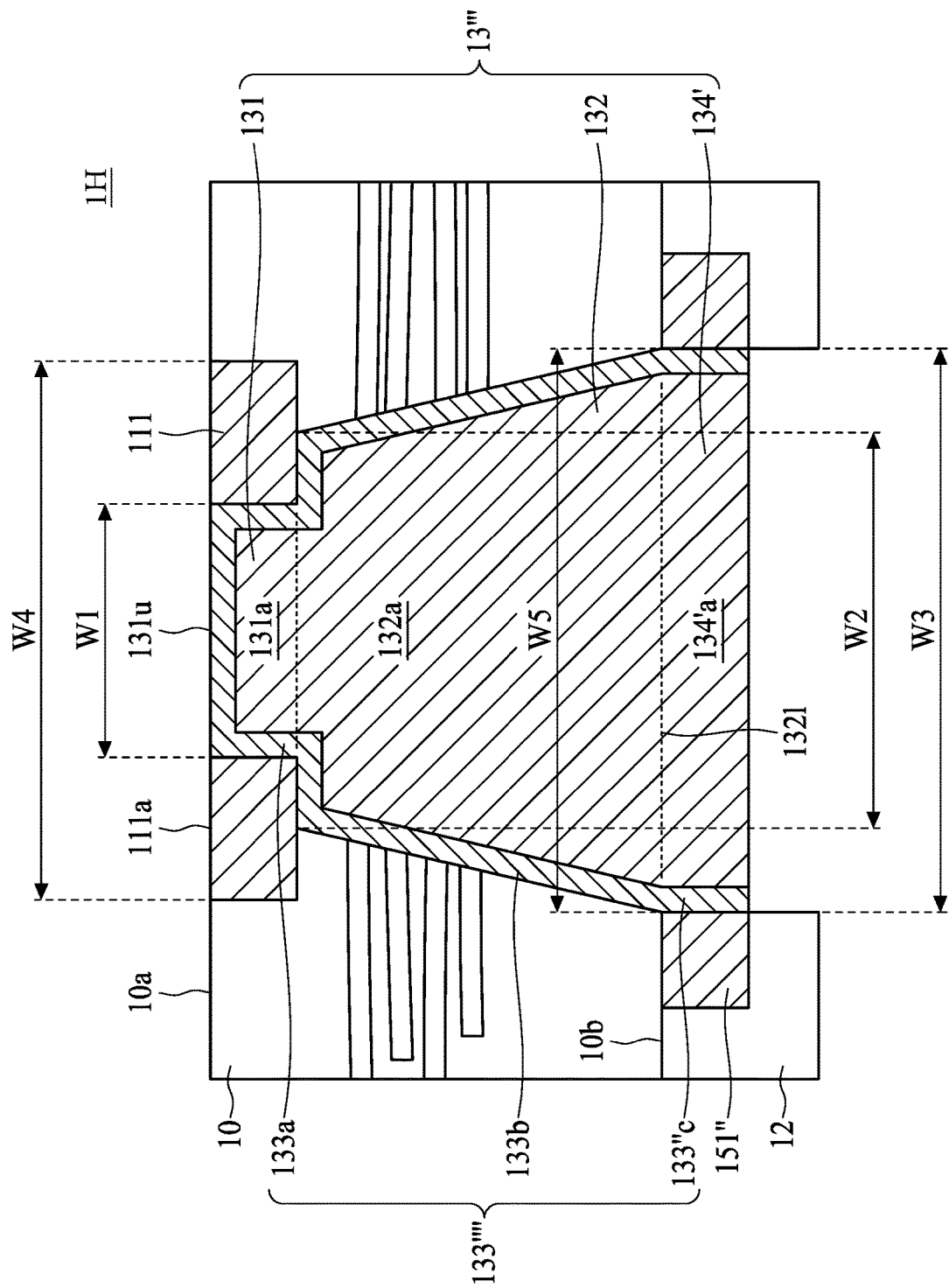
FIG. 1H illustrates a cross-sectional view of an interconnection element according to some embodiments of the present disclosure.

FIG. 1H is a cross-sectional view of an interconnection element 13'''' of a substrate 1H according to some embodiments of the present disclosure. The substrate 1H of FIG. 1H is similar to the substrate of FIG. 1G in certain respects. The substrate 1H includes a patterned conductive layer 133''' that includes portions 133a, 133b, and 133"c. For the substrate 1H, a width W5' of a portion 134' is greater than the width W2 of the portion 132 and the width W5' of the portion 134' is substantially equal to the width W3 of the portion 132. The portion 134' includes a portion 134'a and the portion 133"c of the patterned conductive layer 133''''. The portion 134' is surrounded by a ring/annular structure of a conductive pad 151".

Figure 2:
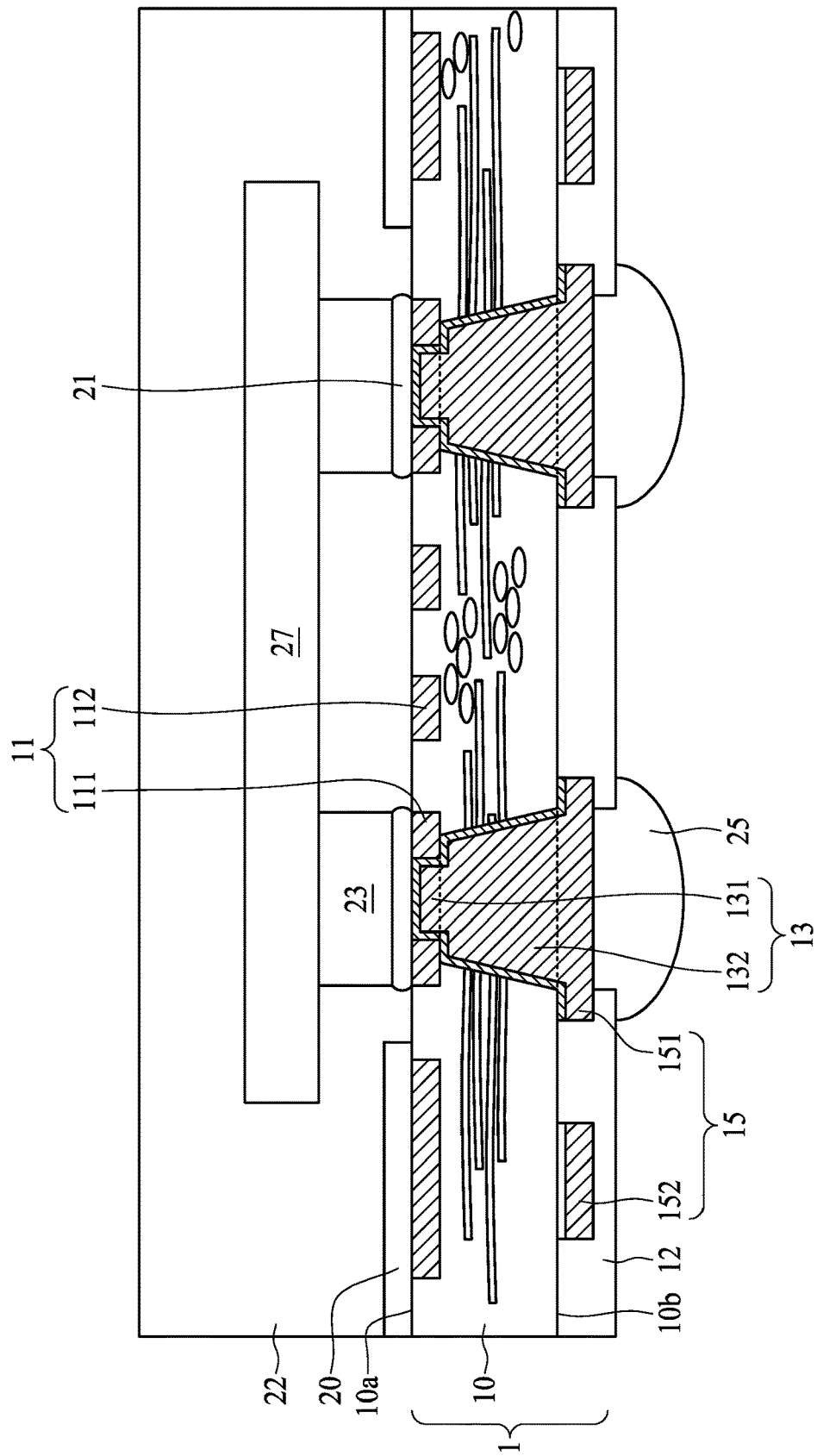
FIG. 2 illustrates a cross-sectional view of a semiconductor device package according to some embodiments of the present disclosure.

FIG. 2 is a cross-sectional view of a semiconductor device package 2 according to some embodiments of the present disclosure. The semiconductor device package 2 includes a substrate 1, a dielectric layer 20, a connection element 21, an encapsulant 22, a conductive post 23, a solder ball 25, and a semiconductor device 27.

The dielectric layer 20 is disposed on the substrate 1. The dielectric layer 20 may include a solder resist, such as a passivation material, a resin, or a polymer.

The connection element 21 is disposed between the substrate 1 and the conductive post 23. The semiconductor device 27 includes an active surface facing the surface 10a of the dielectric layer 10. The semiconductor device 27 is electrically connected to the patterned conductive layer 11 through the connection element 21 and the conductive post 23. The semiconductor device 27 is electrically connected to the ring/annular structure of the conductive pad 111. The semiconductor device 27 may be a flip chip type device. The connection element 21 contacts the conductive pad 111 of the patterned conductive layer 11 and the interconnection element 13. The connection element 21 may include a solder material, tin (Sn), or other suitable materials. The conductive post 23 may include a conductive metal such as copper (Cu), gold (Au), or other suitable materials. The encapsulant 22 is disposed on the surface 10a of the dielectric layer 10. The encapsulant 22 encapsulates the substrate 1 and the semiconductor device 27. The solder ball 25 is disposed in the opening of the dielectric layer 12. The solder ball 25 is electrically connected to the conductive pad 151.

Since the interconnection element 13 is embedded in the ring/annular structure of the conductive pad 111, the shape of the interconnection element 13 can be regular and the interconnection element 13 can be located with specificity.

Figure 3A:
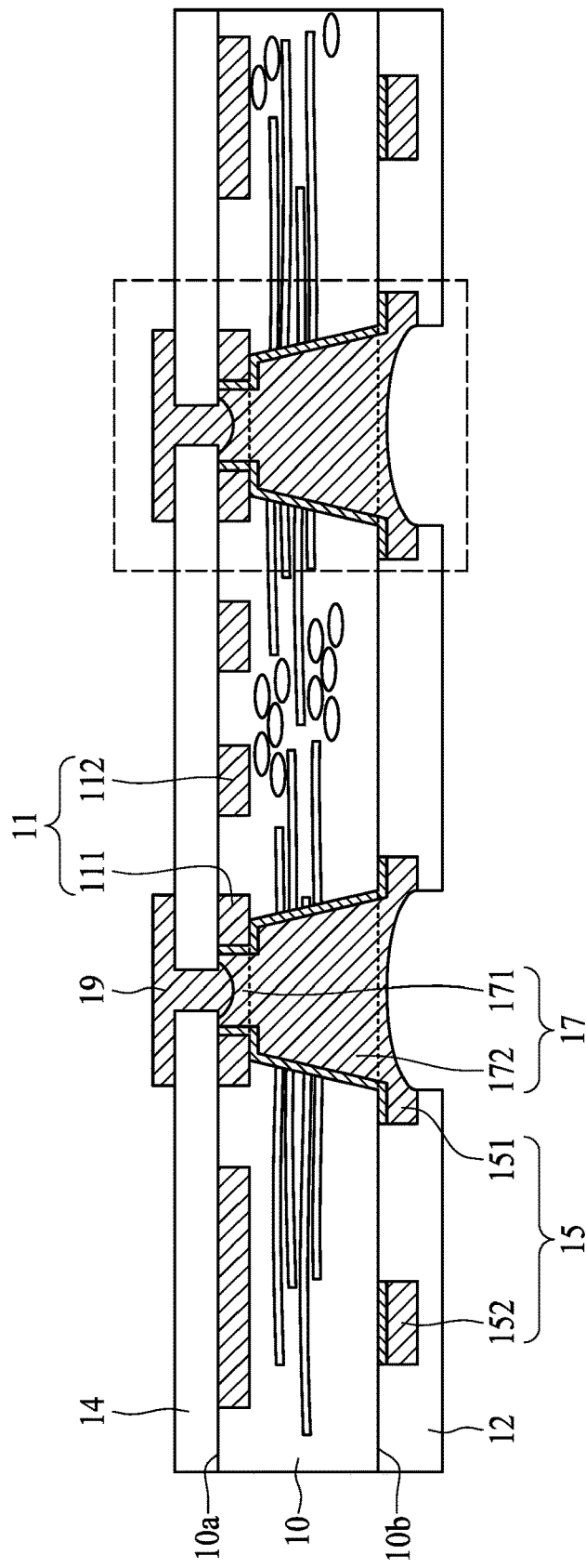
FIG. 3A illustrates a cross-sectional view of a substrate according to some embodiments of the present disclosure.

FIG. 3A is a cross-sectional view of a substrate 3 in accordance with some embodiments of the present disclosure. The substrate 3 includes a dielectric layer 10, a patterned conductive layer 11, a dielectric layer 12, a dielectric layer 14, a patterned conductive layer 15, an interconnection element 17, and an external conductive pad 19.

The dielectric layer 10 has a surface 10a and a surface 10b opposite to the surface 10a. The dielectric layer 10 includes a resin layer and a fiberglass.

The patterned conductive layer 11 is adjacent to the surface 10a of the dielectric layer 10. The patterned conductive layer 11 includes a conductive pad 111 and a conductive trace 112 adjacent to the conductive pad 111. The conductive pad 111 includes an interconnection structure, such as a ring/annular structure. The conductive pad 111 and the conductive trace 112 of the patterned conductive layer 11 are embedded in the dielectric layer 10.

The patterned conductive layer 15 is adjacent to the surface 10b of the dielectric layer 10. The patterned conductive layer 15 includes a conductive pad 151 and a conductive trace 152 adjacent to the conductive pad 151. The conductive pad 151 and the conductive trace 152 of the patterned conductive layer 15 are disposed on the surface 10b of the dielectric layer 10. In some embodiments, a width of the conductive trace 112 of the patterned conductive layer 11 is less than a width of the conductive trace 152 of the patterned conductive layer 15 (e.g. a ratio of the width of the conductive trace 112 to the width of the conductive trace 152 is about 0.9 or less, about 0.8 or less, or about 0.7 or less). A length of the conductive trace 112 of the patterned conductive layer 11 is less than a length of the conductive trace 152 of the patterned conductive layer 15 (e.g. a ratio of the length of the conductive trace 112 to the length of the conductive trace 152 is about 0.9 or less, about 0.8 or less, or about 0.7 or less).

The interconnection element 17 includes a portion 171 and a portion 172. The interconnection element 17 extends at least from the surface 10a of the dielectric layer 10 to the surface 10b of the dielectric layer 10. The portion 171 of the interconnection element 17 is surrounded by the ring/annular structure of the conductive pad 111. The portion 172 of the interconnection element 17 is covered by the conductive pad 111. The interconnection element 17 electrically connects the conductive pad 111 of the patterned conductive layer 11 to the conductive pad 151 of the patterned conductive layer 15. The interconnection element 17 may be a conductive via. The interconnection element 17 may be, or may include, copper, aluminum, gold, another metal, a metal alloy, another suitable conductive material, or a combination thereof. The material of the interconnection element 17 may be the same as or different from the material of the patterned conductive layer 11 or 15.

The portion 171 has a cylinder-like structure. The portion 172 has a conic-like structure. In some embodiments, the portion 171 has a cylindrical structure that defines an upper recess. The portion 171 may be a solid cylindrical post, a solid square post, or a solid post with another suitable polygonal or non-polygonal shape. The portion 172 has a conic structure or a volcanic cone structure. The portion 171 is embedded in the ring/annular structure of the conductive pad 111.

The dielectric layer 14 is disposed on the surface 10a of the dielectric layer 10. The dielectric layer 14 defines an opening to partially expose the portion 171. The patterned conductive layer 11 is covered by the dielectric layer 14.

The external conductive pad 19 is disposed on the dielectric layer 14. The external conductive pad 19 extends to the interconnection element 17. The external conductive pad 19 is electrically connected to the conductive pad 151 through the interconnection element 17. The external conductive pad 19 contacts the dielectric layer 14 and the portion 171. A portion of the external conductive pad 19 is surrounded by the dielectric layer 14. A portion of the external conductive pad 19 is surrounded by the portion 171. A portion of the external conductive pad 19 is surrounded by the conductive pad 111. The external conductive pad 19 has a T-shape. The external conductive pad 19 has an anchor shape. The external conductive pad 19 includes a portion that protrudes through the dielectric layer 20 and into the portion 171.

The dielectric layer 12 is disposed on the surface 10b of the dielectric layer 10. The dielectric layer 12 defines an opening to partially expose the conductive pad 151. The conductive trace 152 is covered by the dielectric layer 12.

Figure 3B:
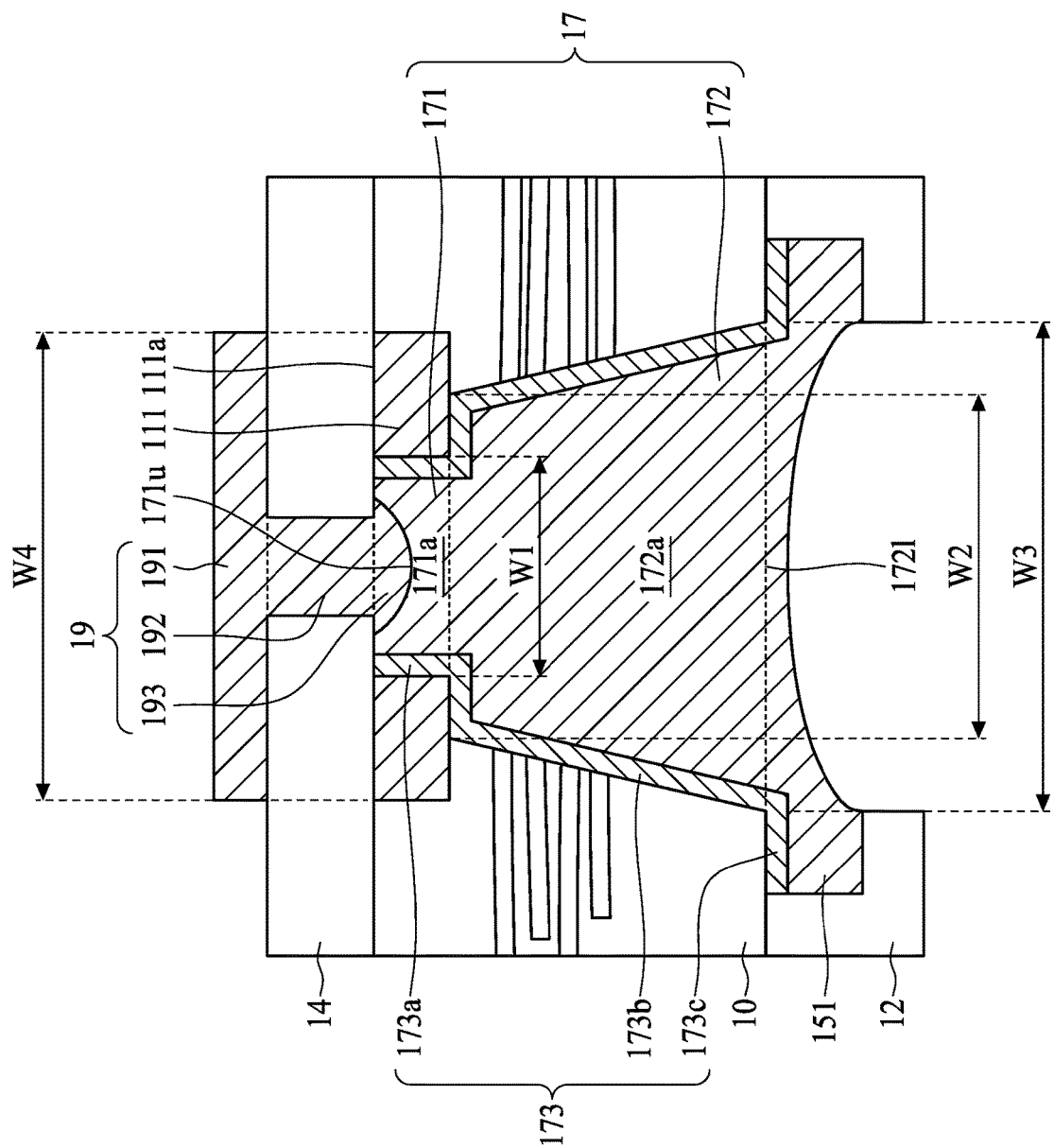
FIG. 3B illustrates a cross-sectional view of an interconnection element according to some embodiments of the present disclosure.

FIG. 3B is a cross-sectional view of the interconnection element 17 according to some embodiments of the present disclosure, and shows an enlarged view of a region delimited by a dashed line in FIG. 3A.

The conductive pad 111 has a surface 111a. The surface 111a of the conductive pad 111 and the surface 10a of the dielectric layer 10 are substantially coplanar. The conductive pad 111 has a width W4 (e.g., a diameter or a width). The portion 171 of the interconnection element 17 has a surface 171u that includes a curved portion (or recess portion) having a curved shape, and a substantially planar portion. The planar portion of the surface 171u of the portion 171 and the surface 111a of the conductive pad 111 are substantially coplanar. The curved portion of the surface 171u of the portion 171 is lower than the surface 111a of the conductive pad 111. A width of the surface 171u of the interconnection element 17 is greater than a width of an opening of the dielectric layer 14.

The patterned conductive layer 173 includes a portion 173a, a portion 173b, and a portion 173c. The portion 171 of the interconnection element 17 includes a portion 171a and the portion 173a of the patterned conductive layer 173. The portion 172 of the interconnection element 17 includes a portion 172a and the portion 173b of the patterned conductive layer 173. The portion 173c of the patterned conductive layer 173 contacts the conductive pad 151. The patterned conductive layer 173 is a seed layer. The patterned conductive layer 173 is in contact with the dielectric layer 10, the ring/annular structure of the patterned conductive layer 11, and the dielectric layer 14.

The interconnection element 17 has the surface 171u and a surface 172l opposite to the surface 171u. The surface 172l of the portion 172 and the surface 10b of the dielectric layer 10 are substantially coplanar. The interconnection element 17 tapers from the surface 172l to the surface 171u. A width W1 of the portion 171 is less than a width W2 of the portion 172 (e.g. a ratio of the width W1 to the width W2 is about 0.9 or less, about 0.8 or less, or about 0.7 or less). The width W2 of the portion 172 is less than a width W3 of the portion 172 (e.g. a ratio of the width W2 to the width W3 is about 0.9 or less, about 0.8 or less, or about 0.7 or less). The width W3 may be a maximum width of the portion 172. The portion 172 tapers from a lower surface of the portion 172 to an upper surface of the portion 172. The width W4 of the conductive pad 111 is greater than or equal to the width W2 of the portion 172 of the interconnection element 17.

The size (e.g. length or width) of the conductive pad 111 may be flexibly specified. The width W4 of the conductive pad 111 may be less than or equal to the width W3 of the portion 132 (e.g. a ratio of the width W4 to the width W3 is about 0.9 or less, about 0.8 or less, or about 0.7 or less). The width W4 of the conductive pad 111 is in a range from approximately 75 μm to approximately 80 μm.

In one or more embodiments, the portion 171 of the interconnection element 17 is solidly embedded in the ring/annular structure of the conductive pad 111. Since the interconnection element 17 is substantially surrounded in three dimensions by the conductive pad 111, the stress at an interface between the interconnection element 17 and the conductive pad 111 can be mitigated. A crack forming at the interface can be effectively avoided.

The external conductive pad 19 includes a portion 191, a portion 192, and a portion 193. The portion 191 is disposed on and covers the dielectric layer 14. The portion 192 is embedded in the dielectric layer 14. The portion 193 (also referred to as a protruding portion) is embedded in the ring/annular structure of the conductive pad 111. The portion 193 is surrounded by the portion 171. The portion 193 contacts the dielectric layer 14 and the portion 171a of the portion 171.

Figure 3C:
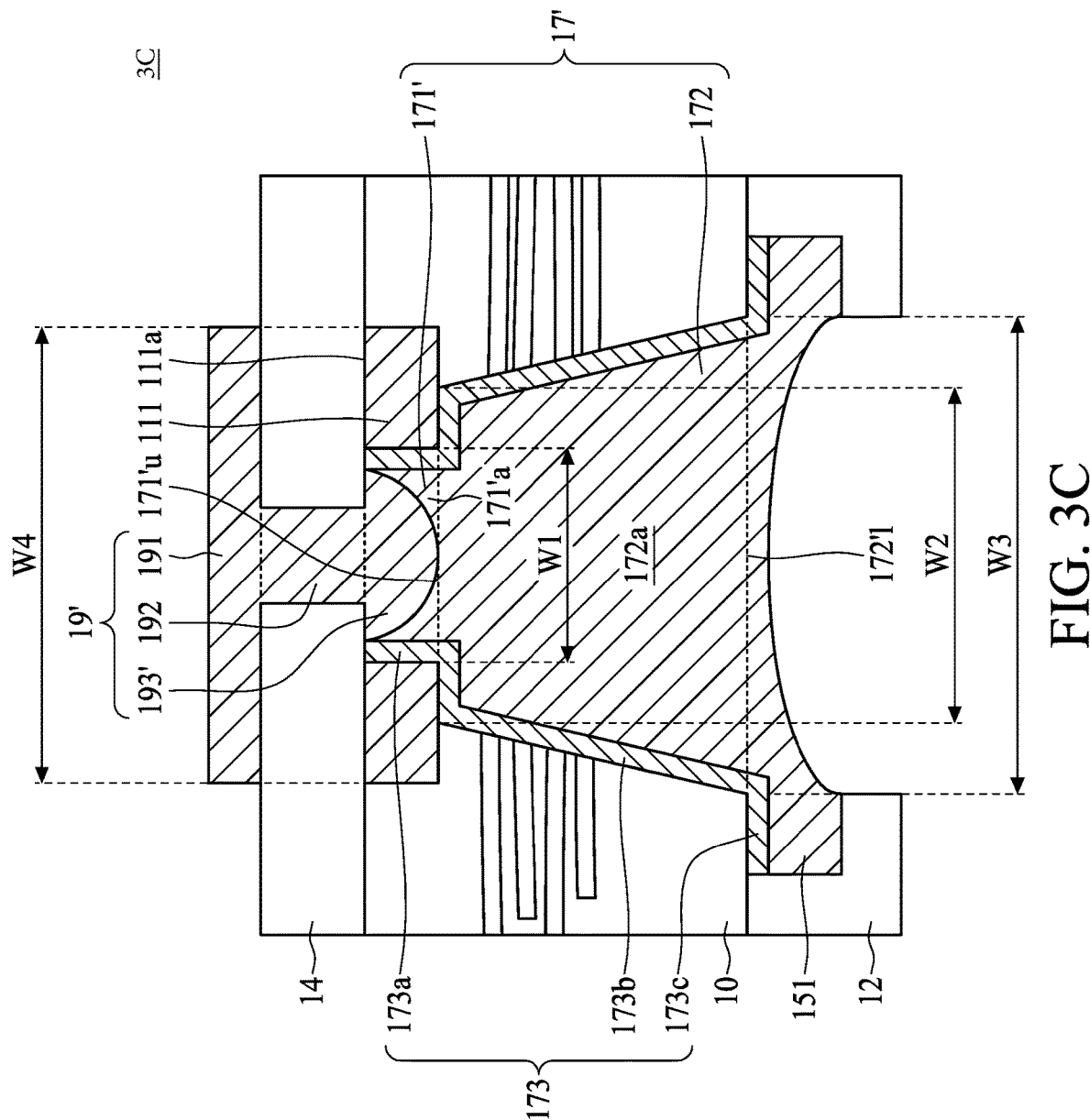
FIG. 3C illustrates a cross-sectional view of an interconnection element according to some embodiments of the present disclosure.

FIG. 3C is a cross-sectional view of an interconnection element 17' of a substrate 3C according to some embodiments of the present disclosure. The substrate 3C of FIG. 3C is similar to the substrate 3 of FIG. 3B. An external conductive pad 19' of the substrate 3C includes a portion 193' (also referred to as a protruding portion) that contacts a dielectric layer 14, a portion 171'a and a portion 173a of a portion 171' of the interconnection element 17'. The portion 193' of the external conductive pad 19' may protrude into the interconnection element 17' of the substrate 3C, and may contact a portion 172a of the interconnection element 17'. A size of the portion 193' of FIG. 3C may be greater than a size of the portion 193 of FIG. 3B.

Figure 3D:
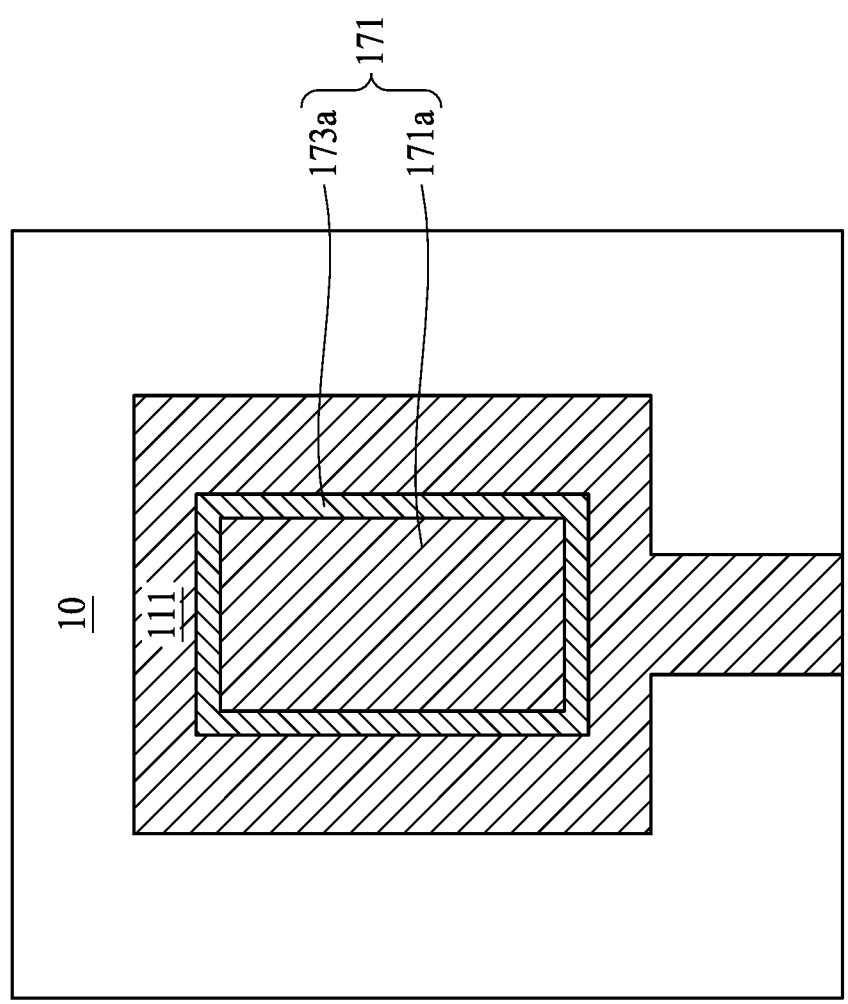
FIG. 3D illustrates a top view of a substrate according to some embodiments of the present disclosure.

FIG. 3D is a top view of the substrate 3 according to some embodiments of the present disclosure. The ring/annular structure of the conductive pad 111 surrounds the portion 171 (including the portion 171a and the portion 173a of the patterned conductive layer 173) of the interconnection element 17. The shape of the conductive pad 111 or the interconnection element 17 may be set according to design specifications. The shape of the conductive pad 111 may be a circle or a polygon. The shape of the ring/annular structure of the conductive pad 111 may be a circle or a polygon.

Figure 3E:
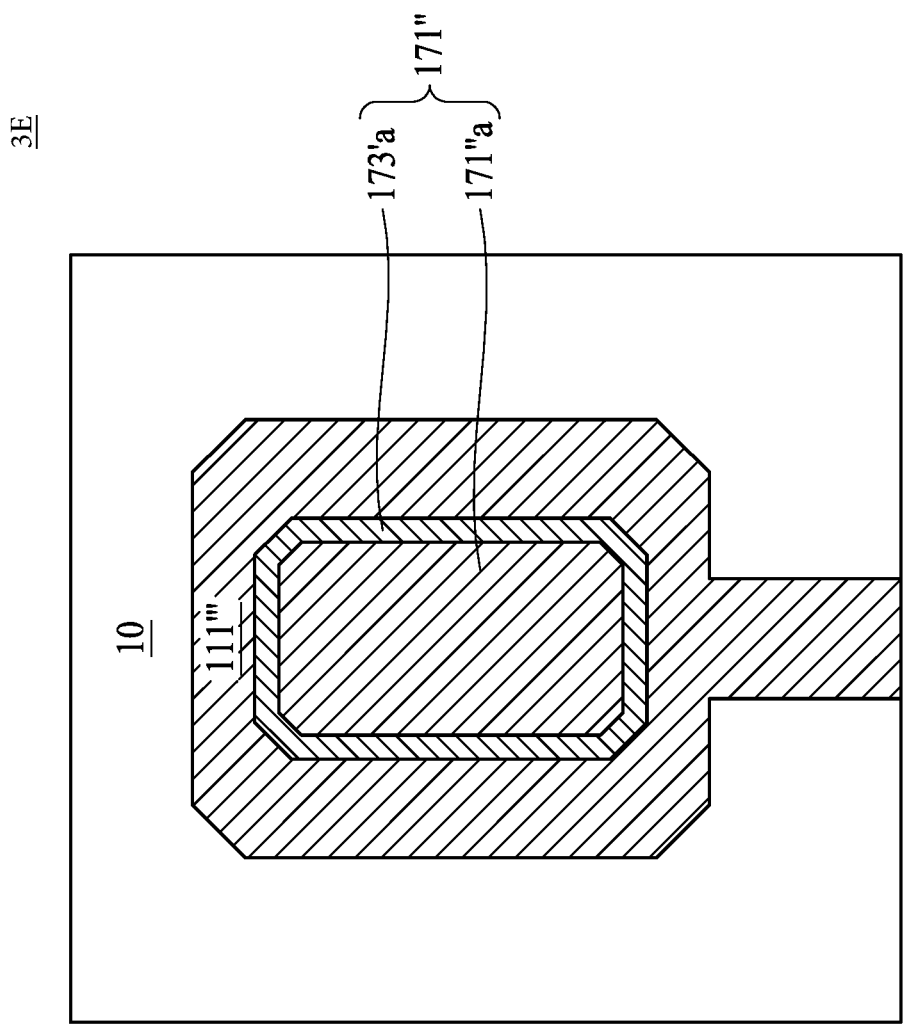
FIG. 3E illustrates a top view of a substrate according to some embodiments of the present disclosure.

FIG. 3E is a top view of a substrate 3E according to some embodiments of the present disclosure. The substrate 3E of FIG. 3E is similar to the substrate 3 of FIG. 3D. In the substrate 3E a conductive pad 111''' includes four chamfers (e.g. at corner portions) and a portion 171'' includes four chamfers (e.g. at corner portions). A shape of the conductive pad 111''' or a ring/annular structure of the conductive pad 111''' is an octagon and a shape of the portion 171'' (including a portion 171''a and a portion 173'a of a patterned conductive layer 173') is an octagon.

Figure 4:
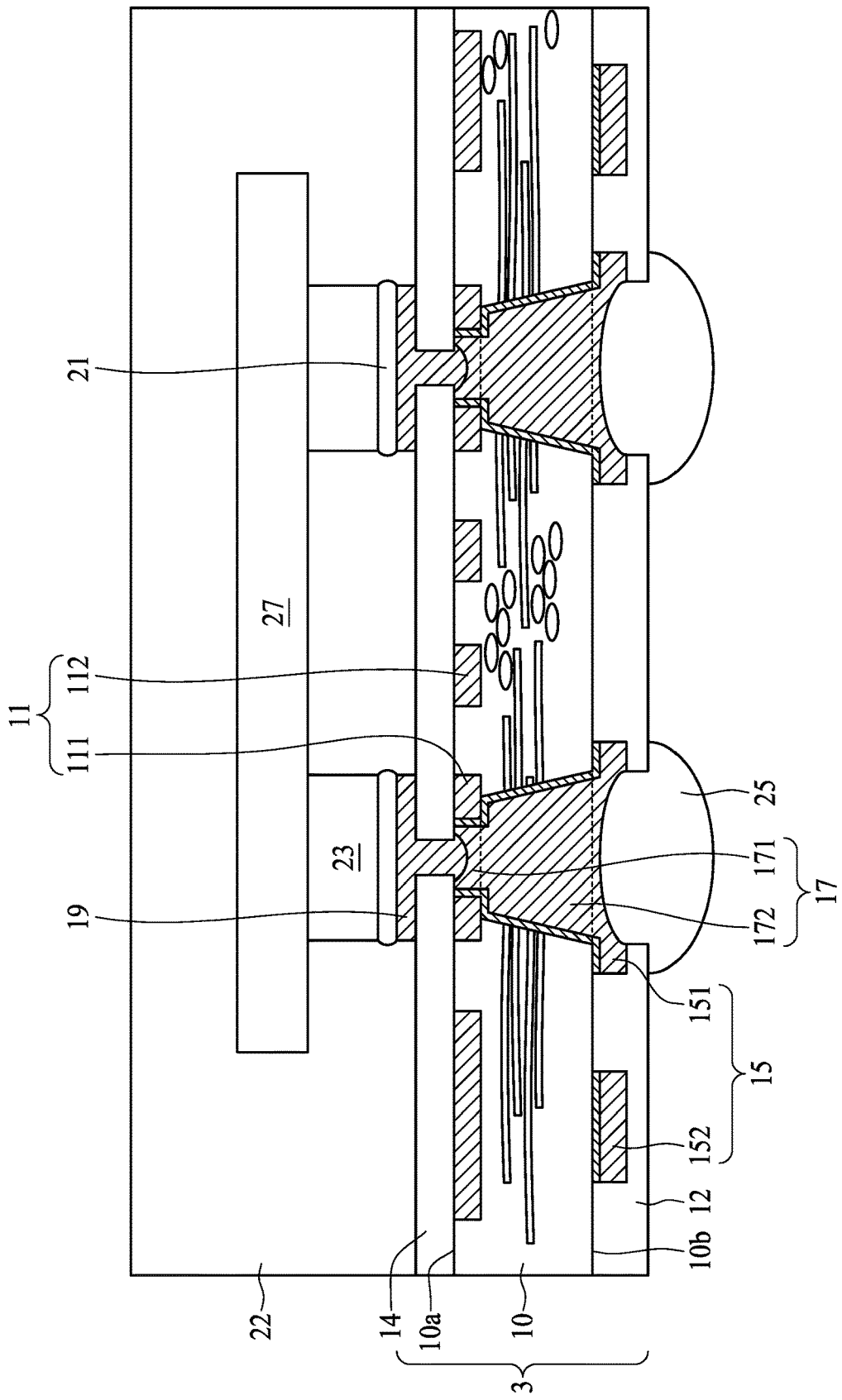
FIG. 4 illustrates a cross-sectional view of a semiconductor device package according to some embodiments of the present disclosure.

FIG. 4 is a cross-sectional view of a semiconductor device package 4 according to some embodiments of the present disclosure. The semiconductor device package 4 includes a substrate 3, a connection element 21, an encapsulant 22, a conductive post 23, a solder ball 25, and a semiconductor device 27.

The connection element 21 is disposed between the substrate 3 and the conductive post 23. The semiconductor device 27 includes an active surface facing the surface 10a of the dielectric layer 10. The semiconductor device 27 is electrically connected to the patterned conductive layer 11 through the connection element 21, the conductive post 23, and the external conductive pad 19. The semiconductor device 27 is electrically connected to the ring/annular structure of the conductive pad 111. The semiconductor device 27 may be a flip chip type device. The connection element 21 contacts the external conductive pad 19. The connection element 21 may include a solder material, Sn, or other suitable materials. The conductive post 23 may include Cu, Au, or other suitable materials. The encapsulant 22 is disposed on the surface 10a of the dielectric layer 10. The encapsulant 22 encapsulates the substrate 3 and the semiconductor device 27. The solder ball 25 is disposed in the opening of the dielectric layer 12. The solder ball 25 is electrically connected to the conductive pad 151.

Since the interconnection element 17 is embedded in the ring/annular structure of the conductive pad 111, the shape of the interconnection element 17 can be regular and the interconnection element 17 can be located with specificity.

FIG. 5A through FIG. 5E illustrate a method of manufacturing the substrate 1 of FIG. 1A according to some embodiments of the present disclosure. In some embodiments, the method of FIG. 5A through FIG. 5E may be applied to manufacture the substrate 3 of FIG. 3A. In the below description, formation of a single interconnection element 13 and of other components may be described, but in one or more embodiments formation of multiple interconnection elements 13 and/or of other components may be implemented using the methods described herein.

Referring to FIG. 5A, a method for manufacturing the substrate 1 includes providing a carrier 50 and a conductive layer disposed on the carrier 50. The conductive layer is patterned to form a patterned conductive layer 11. A conductive pad 111 and a conductive trace 112 of the patterned conductive layer 11 are defined during the patterning operation. A ring/annular structure of the conductive pad 111 is defined during the patterning operation. The ring/annular structure of the conductive pad 111 defines an opening. The sizes of the pad and trance may be defined according to design specifications.

Figure 5B:
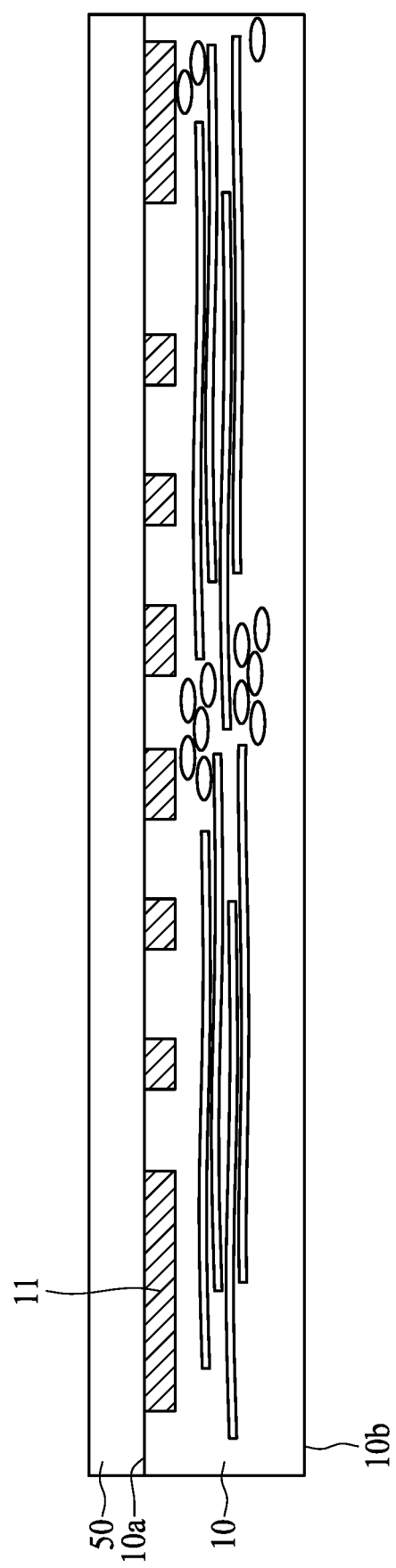
FIG. 5B illustrates a method of manufacturing a substrate according to some embodiments of the present disclosure.

Referring to FIG. 5B, a dielectric layer 10 is laminated on the carrier 50. Other components, such as a redistribution layer and/or fillers may be included in the dielectric layer 10.

Figure 5C:
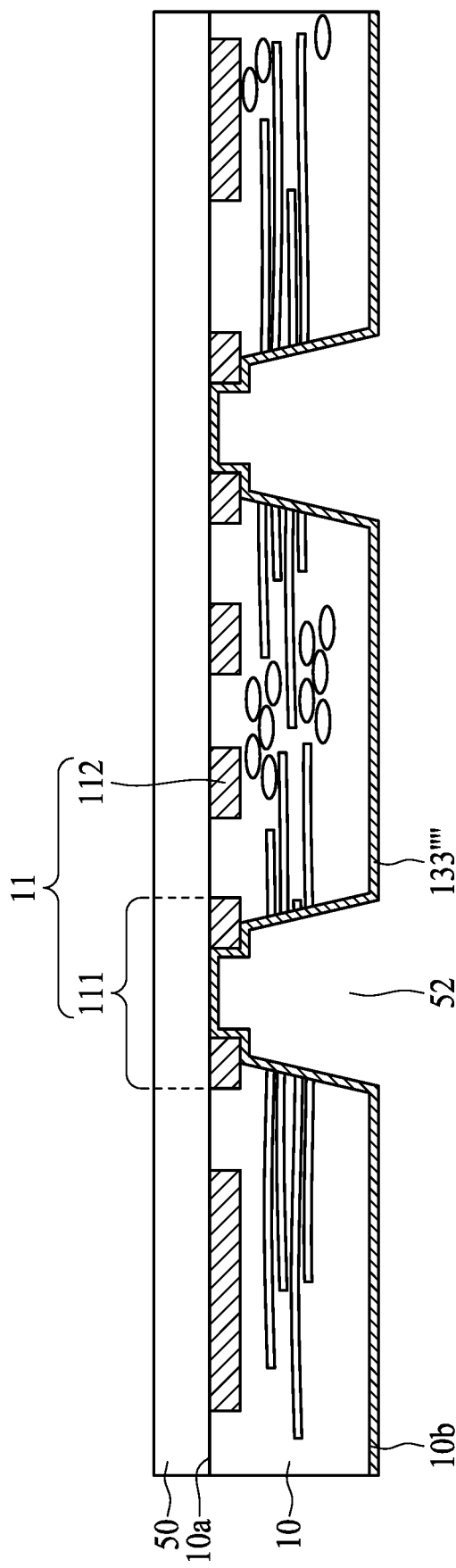
FIG. 5C illustrates a method of manufacturing a substrate according to some embodiments of the present disclosure.

Referring to FIG. 5C, an opening 52 is formed in the dielectric layer 10 by a laser drilling operation, a mechanical drilling operation, or other suitable operations. The opening of the conductive pad 111 of the patterned conductive layer 11 and the opening 52 of the dielectric layer 10 are continuous.

A conductive layer 133'''' is formed on the dielectric layer 10. The conductive layer 133'''' is formed in the opening of the conductive pad 111 and the opening 52 of the dielectric layer 10. The conductive layer 133'''' is a seed layer. The conductive layer 133'''' may be formed by sputtering or chemical vapor deposition (CVD) operations. The thickness of the conductive layer 133'''' is in a range from approximately 0.2 μm to approximately 0.8 μm.

The patterned conductive layer 11 includes the conductive pad 111 and the conductive trace 112 adjacent to the conductive pad 111. The conductive pad 111 includes the ring/annular structure. During the laser drilling operation, the conductive pad 111 may block the laser such that the shape of the opening 52 is regular and consistent.

In some embodiments, there is a residual portion of the dielectric layer 10 disposed in the opening 52 when the laser drilling operation is finished. The residual portion may correspond to the dielectric layer 16 of FIG. 1F. The residual portion is disposed in a portion of the opening of the ring/annular structure of the conductive pad 111.

Figure 5D:
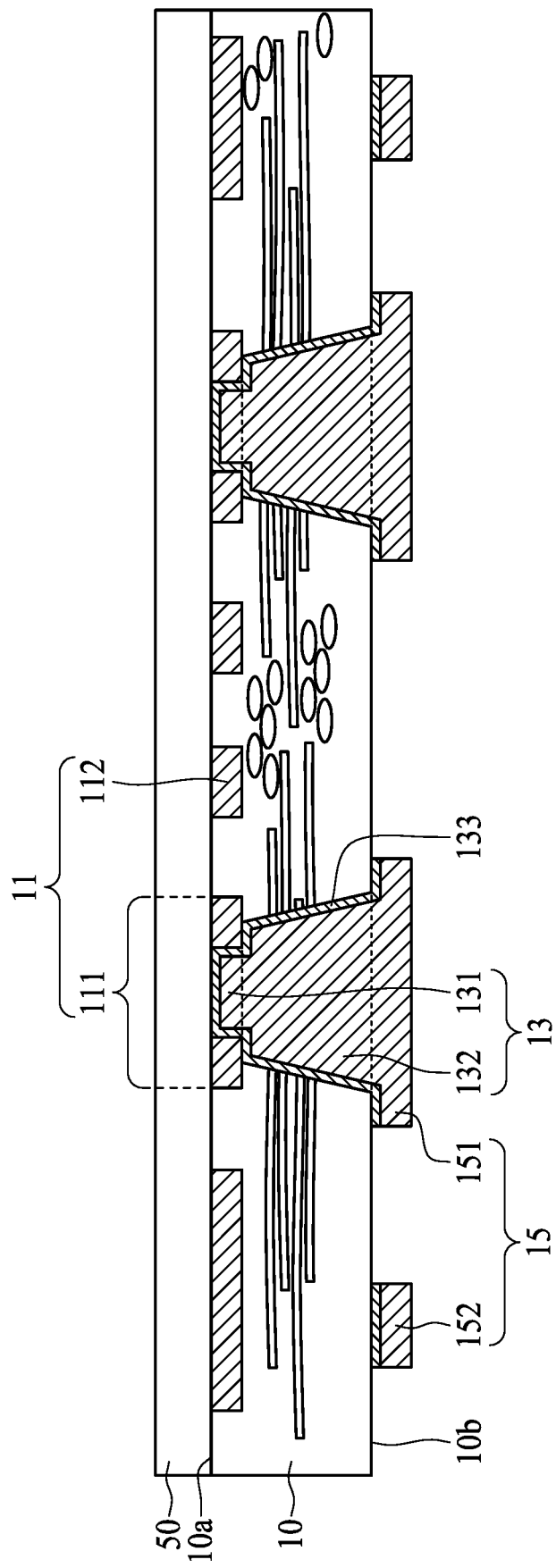
FIG. 5D illustrates a method of manufacturing a substrate according to some embodiments of the present disclosure.

Referring to FIG. 5D, a conductive layer is formed in the opening of the conductive pad 111 and the opening 52 of the dielectric layer 10, and adjacent to the surface 10b of the dielectric layer 10 by an electroplating operation. Subsequently, the conductive layer and the seed layer 133'''' are patterned to form an interconnection element 13, a patterned conductive layer 133, and a patterned conductive layer 15 including a conductive pad 151 and a conductive trace 152. The interconnection element 13 extends to the opening of the ring/annular structure of the conductive pad 111 and is surrounded by the ring/annular structure of the conductive pad 111. The interconnection element 13 in the opening 52 may have a regular and consistent shape.

The interconnection element 13 and at least a portion of the patterned conductive layer 15 (e.g. the conductive pad 151) are formed integrally. The interconnection element 13 and the portion of the patterned conductive layer 15 are formed in one piece or as a monolithic structure. A lattice of the interconnection element 13 and a lattice of the portion of the patterned conductive layer 15 are the same as or similar to each other. There is no discontinuous interface between the interconnection element 13 and the portion of the patterned conductive layer 15.

The materials of the patterned conductive layer 133 and the patterned conductive layer 11 may be different or the same. The materials of the patterned conductive layer 133 and the interconnection element 13 may be different or the same.

Figure 5E:
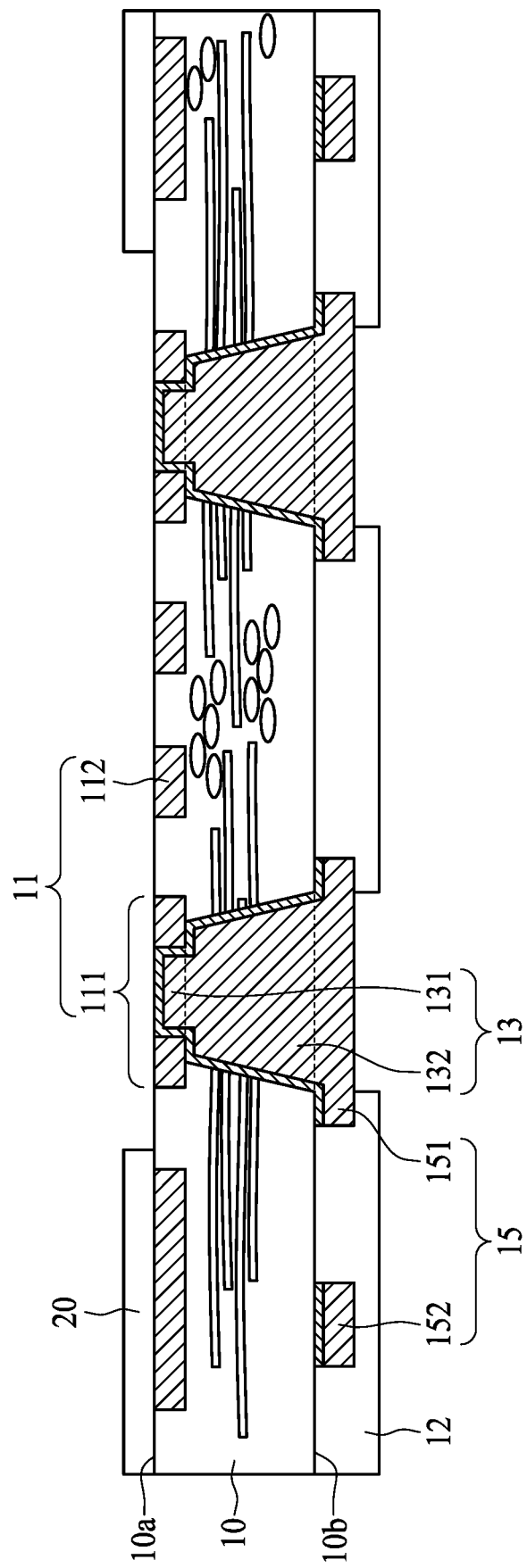
FIG. 5E illustrates a method of manufacturing a substrate according to some embodiments of the present disclosure.

Referring to FIG. 5E, a dielectric layer 12 is formed on the surface 10b of the dielectric layer 10. The dielectric layer 12 may be a solder resist layer. The dielectric layer 12 defines an opening to expose at least a portion of the patterned conductive layer 15 (e.g. the portion disposed on the interconnection element 13). A dielectric layer 20 is disposed on the surface 10a of the dielectric layer 10. The dielectric layer 20 defines an opening to expose the patterned conductive layer 11. The material of the dielectric layer 20 may be the same as or different from the material of the dielectric layer 12. The carrier 50 is removed.

FIG. 6A through FIG. 6K illustrate a method of manufacturing the substrate 3 of FIG. 3A according to some embodiments of the present disclosure.

Figure 6A:
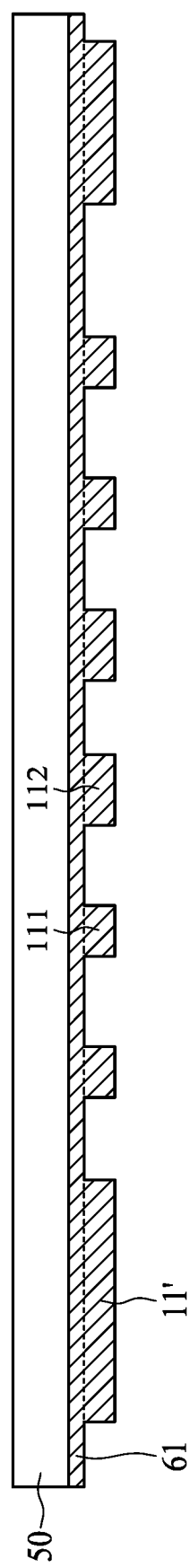
FIG. 6A illustrates a method of manufacturing a substrate according to some embodiments of the present disclosure.

Referring to FIG. 6A, a method for manufacturing the substrate 3 includes providing a carrier 50 and a conductive layer 61 dispose on the carrier 50. The conductive layer 61 is patterned to form a patterned conductive layer 11' on the conductive layer 61. A conductive pad 111 and a conductive trace 112 of the patterned conductive layer 11' are defined during the patterning operation. A ring/annular structure of the conductive pad is defined during a patterning operation. The ring/annular structure of the conductive pad defines an opening. The sizes of the conductive pad 111 and the conductive trace 112 may be set according to design specifications. The conductive layer 61 may function as a stop layer for a subsequent laser drilling operation.

Figure 6B:
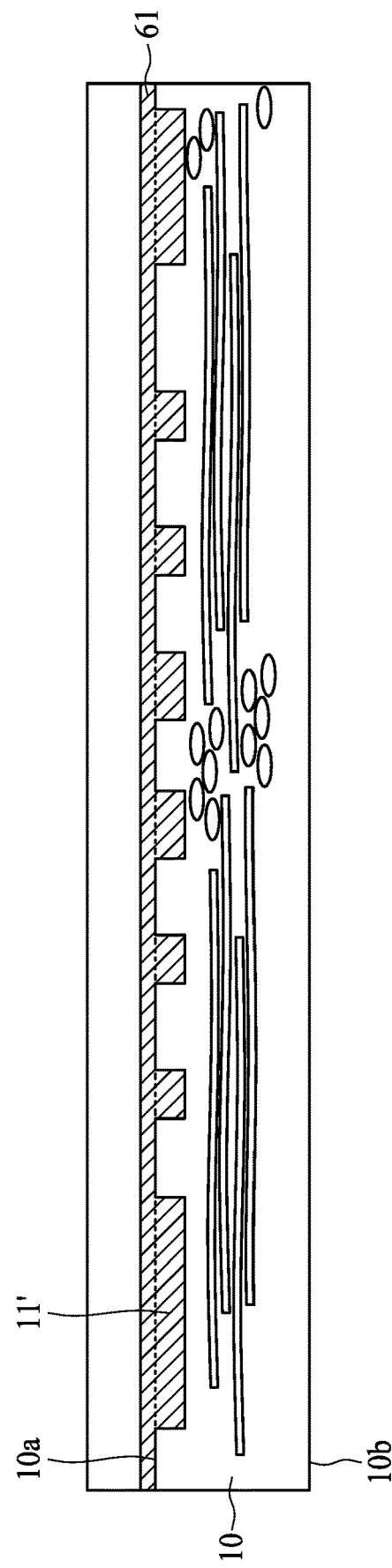
FIG. 6B illustrates a method of manufacturing a substrate according to some embodiments of the present disclosure.

Referring to FIG. 6B, a dielectric layer 10 is laminated on the carrier 50 and the patterned conductive layer 11'. Other components, such as a redistribution layer and/or fillers may be included in the dielectric layer 10.

Figure 6C:
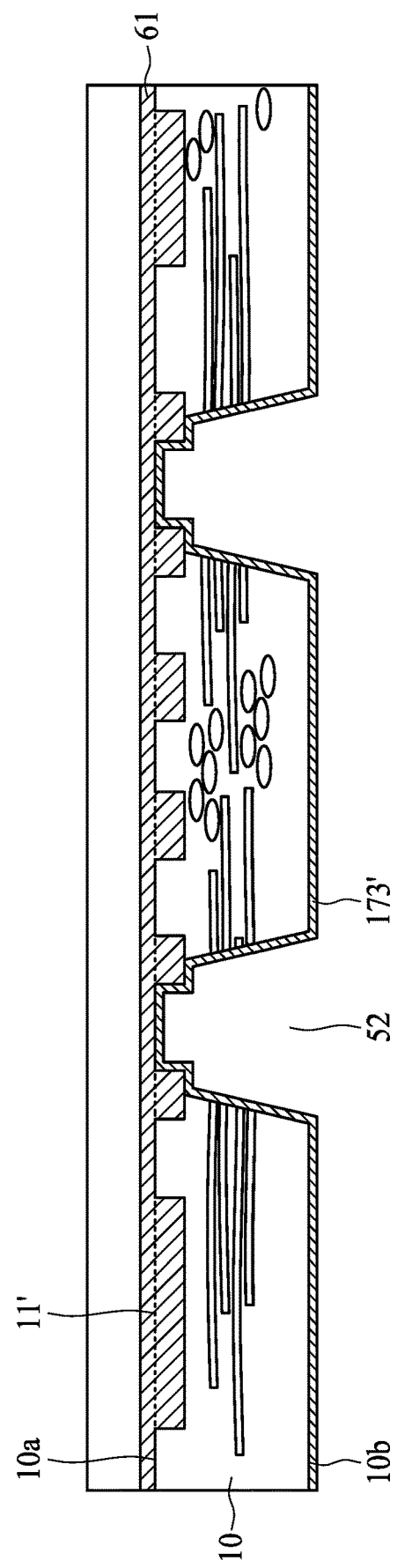
FIG. 6C illustrates a method of manufacturing a substrate according to some embodiments of the present disclosure.

Referring to FIG. 6C, an opening 52 is formed in the dielectric layer 10 by a laser drilling operation, a mechanical drilling operation, or other suitable operations. The opening of the patterned conductive layer 11' and the opening 52 of the dielectric layer 10 are continuous.

A conductive layer 173' is formed on the dielectric layer 10. The conductive layer 173' is a seed layer. During the laser drilling operation, the conductive pad 111 may block the laser such that the shape of the opening 52 is regular and consistent. The laser drilling operation can be stopped at the stop layer 61. A thickness of the stop layer may be in a range from approximately 2 μm to approximately 3 μm.

Figure 6D:
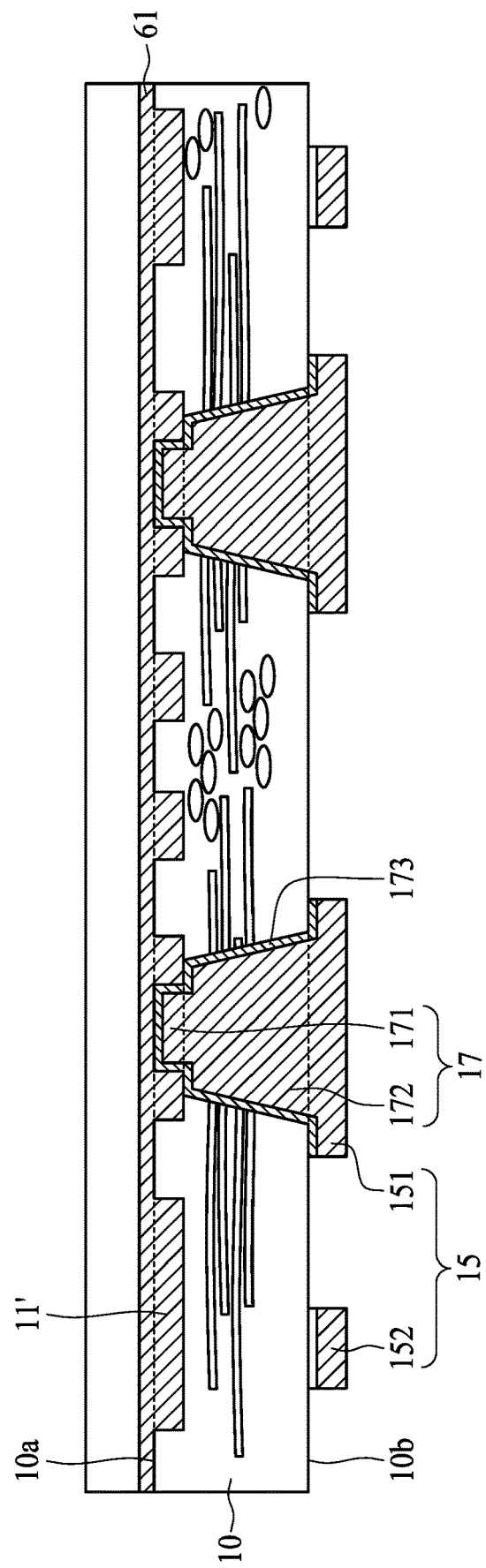
FIG. 6D illustrates a method of manufacturing a substrate according to some embodiments of the present disclosure.

Referring to FIG. 6D, a conductive layer is formed in the opening and on the surface 10b of the dielectric layer 10 by an electroplating operation. Subsequently, the conductive layer and the seed layer 173' are patterned to form an interconnection element 17, a patterned conductive layer 173, and a patterned conductive layer 15 including a conductive pad 151 and a conductive trace 152. The interconnection element 17 extends to the opening of the ring/annular structure of the conductive pad 111 and is surrounded by the ring/annular structure of the conductive pad 111. The interconnection element 17 in the opening 52 can have a regular and consistent shape.

The interconnection element 17 and at least a portion of the patterned conductive layer 15 (e.g. the conductive pad 151) are formed integrally. The interconnection element 17 and the portion of the patterned conductive layer 15 are formed in one piece or as a monolithic structure. A lattice of the interconnection element 17 and a lattice of the portion of the patterned conductive layer 15 are the same as or similar to each other. There is no discontinuous interface between the interconnection element 17 and the portion of the patterned conductive layer 15.

Figure 6E:
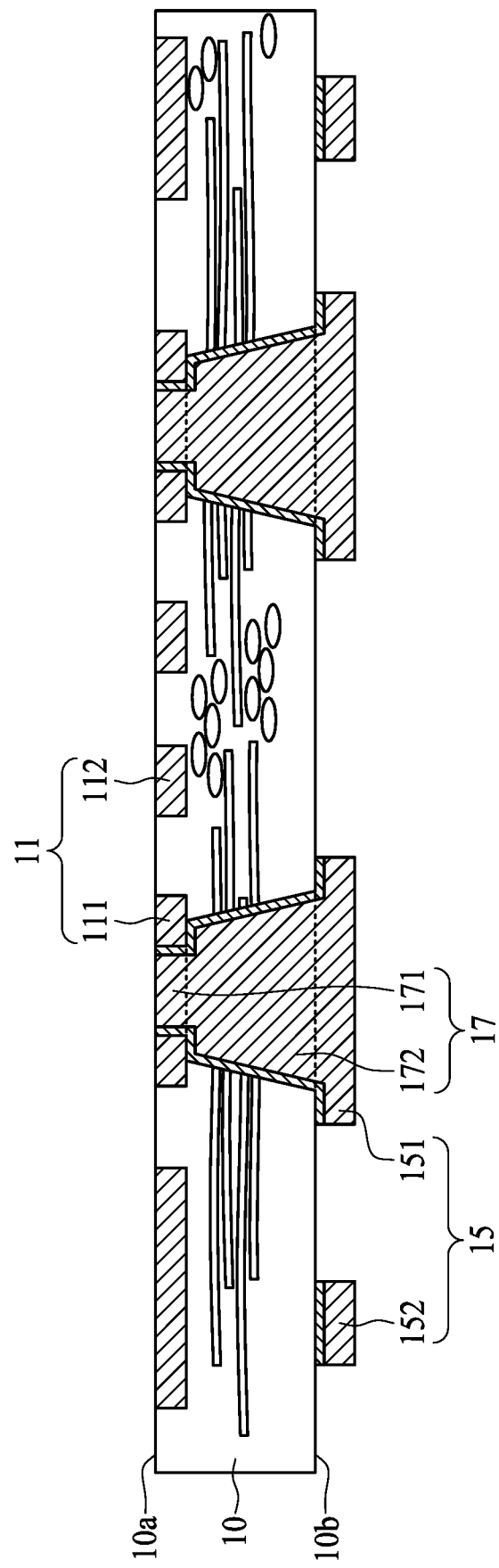
FIG. 6E illustrates a method of manufacturing a substrate according to some embodiments of the present disclosure.

Referring to FIG. 6E, the carrier 50 is removed and the stop layer 61 and part of the patterned conductive layer 11' are removed to form a patterned conductive layer 11. Part of the patterned conductive layer 173 is removed. The patterned conductive layer 11 includes the conductive pad 111 and the conductive trace 112 adjacent to the conductive pad 111. The conductive pad 111 includes a ring/annular structure.

Figure 6F:
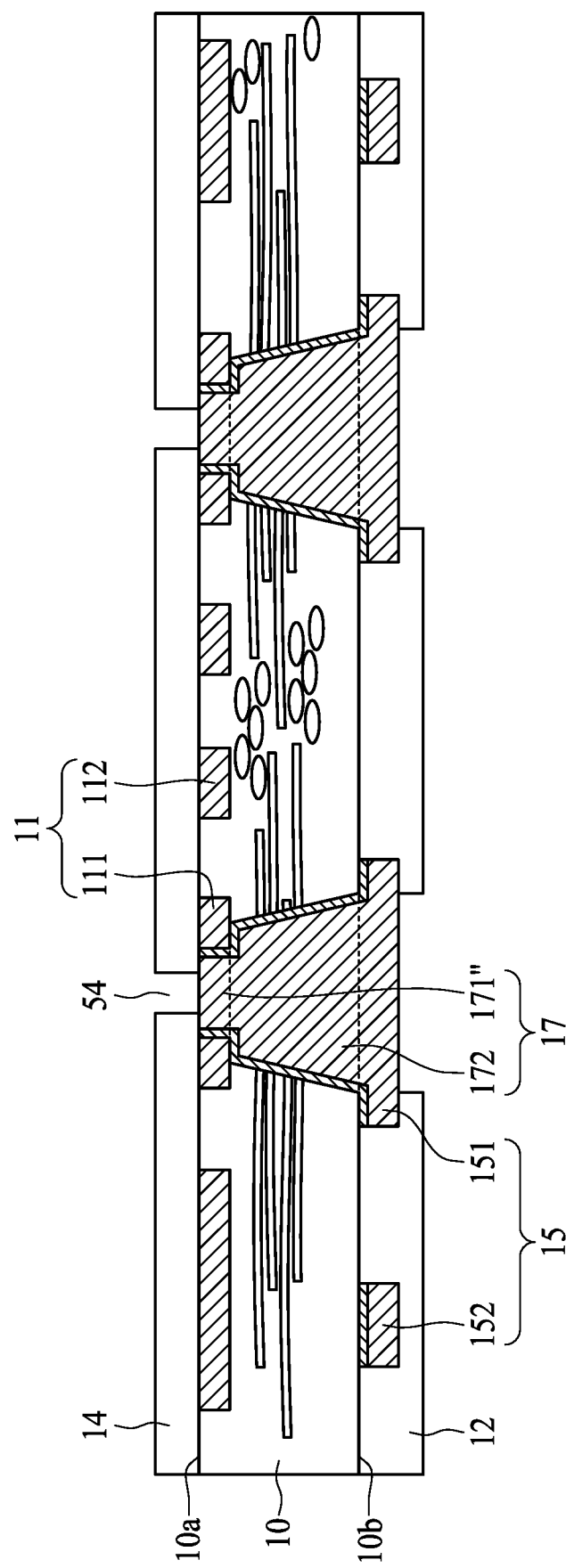
FIG. 6F illustrates a method of manufacturing a substrate according to some embodiments of the present disclosure.

Referring to FIG. 6F, a dielectric layer 12 is formed on the surface 10b of the dielectric layer 10. The dielectric layer 12 may be a solder resist layer. The dielectric layer 12 defines an opening to expose at least a portion of the patterned conductive layer 15 (e.g. the conductive pad 151). A dielectric layer 14 is formed on the surface 10a of the dielectric layer 10 and on the patterned conductive layer 11. The dielectric layer 14 defines an opening to expose the interconnection element 17. The dielectric layer 14 may be a solder resist layer. The material of the dielectric layer 14 may be different from the material of the dielectric layer 12. The interconnection element 17 includes a portion 172 and a portion 171".

Figure 6G:
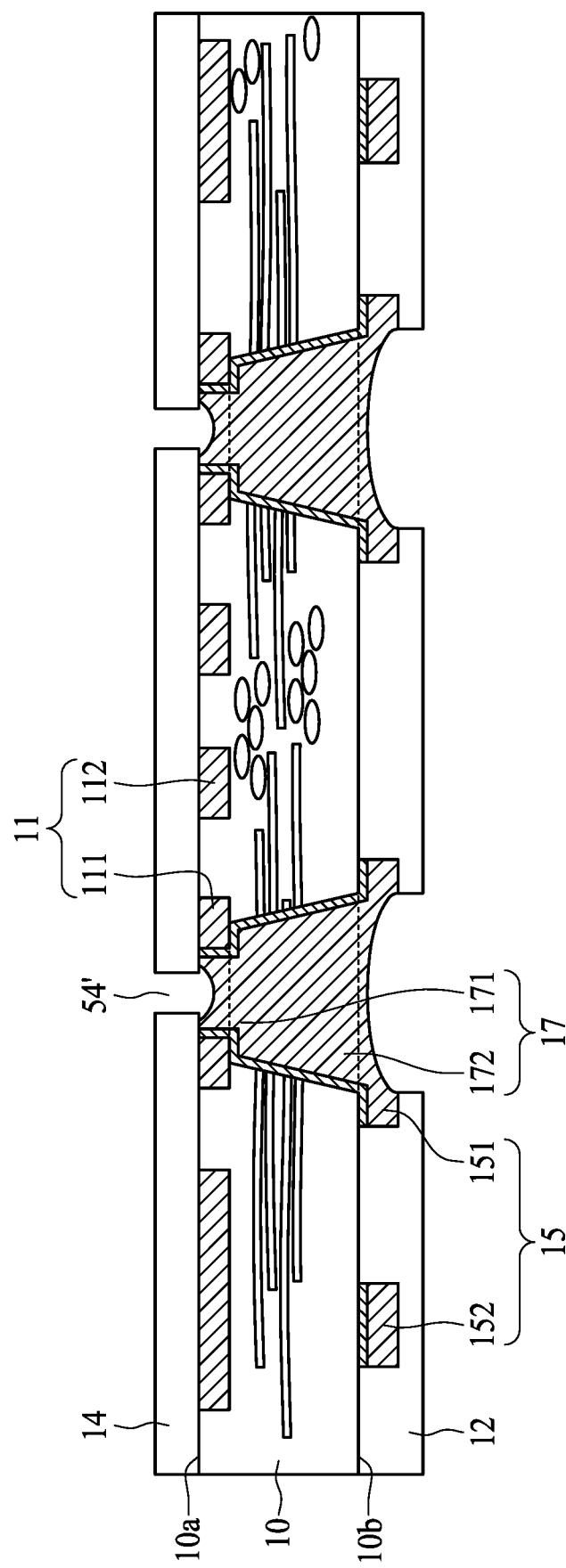
FIG. 6G illustrates a method of manufacturing a substrate according to some embodiments of the present disclosure.

Referring to FIG. 6G, an over-etching/micro-etching operation is performed to form an opening 54' defined by the dielectric layer 14 and the interconnection element 17. The portion 171" of the interconnection element 17 is over-etched to form a portion 171 with a surface that includes a curved portion.

Figure 6H:
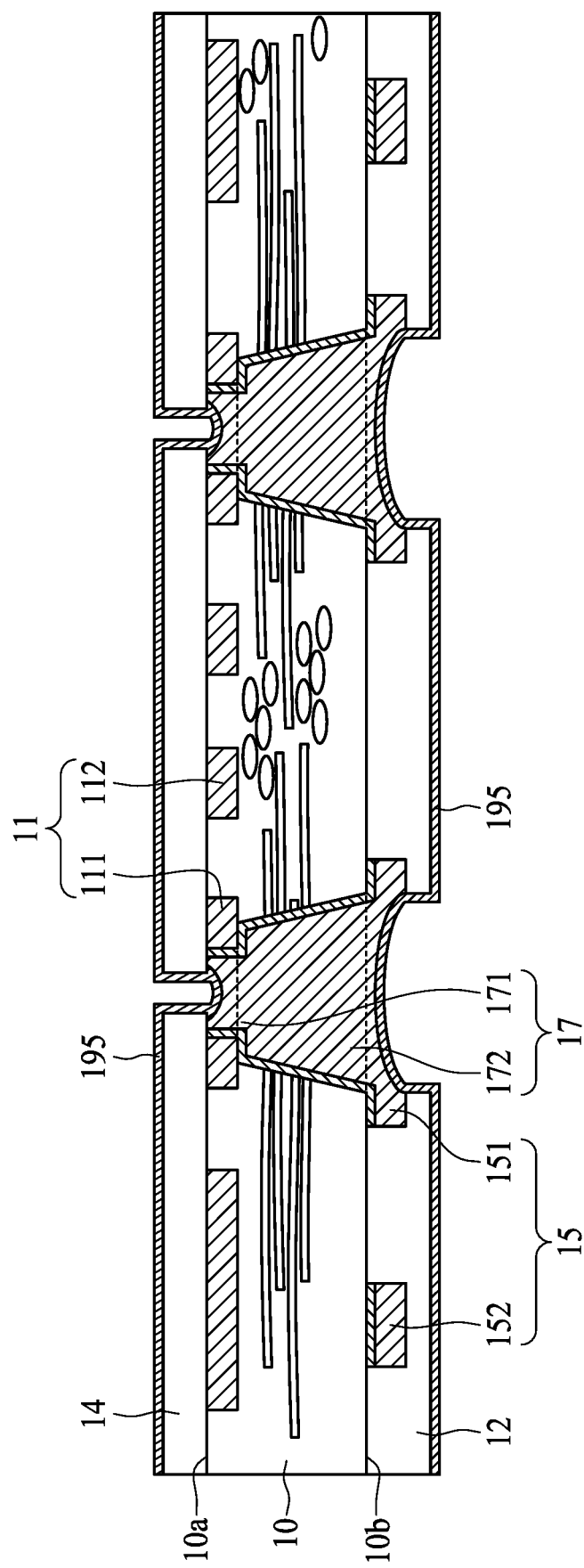
FIG. 6H illustrates a method of manufacturing a substrate according to some embodiments of the present disclosure.

Referring to FIG. 6H, a conductive layer 195 is formed on the dielectric layer 12 and the dielectric layer 14. The conductive layer 195 is a seed layer. A first portion of the conductive layer 195 is disposed on the dielectric layer 12, and a second portion of the conductive layer 195 is disposed on the dielectric layer 14.

Figure 6I:
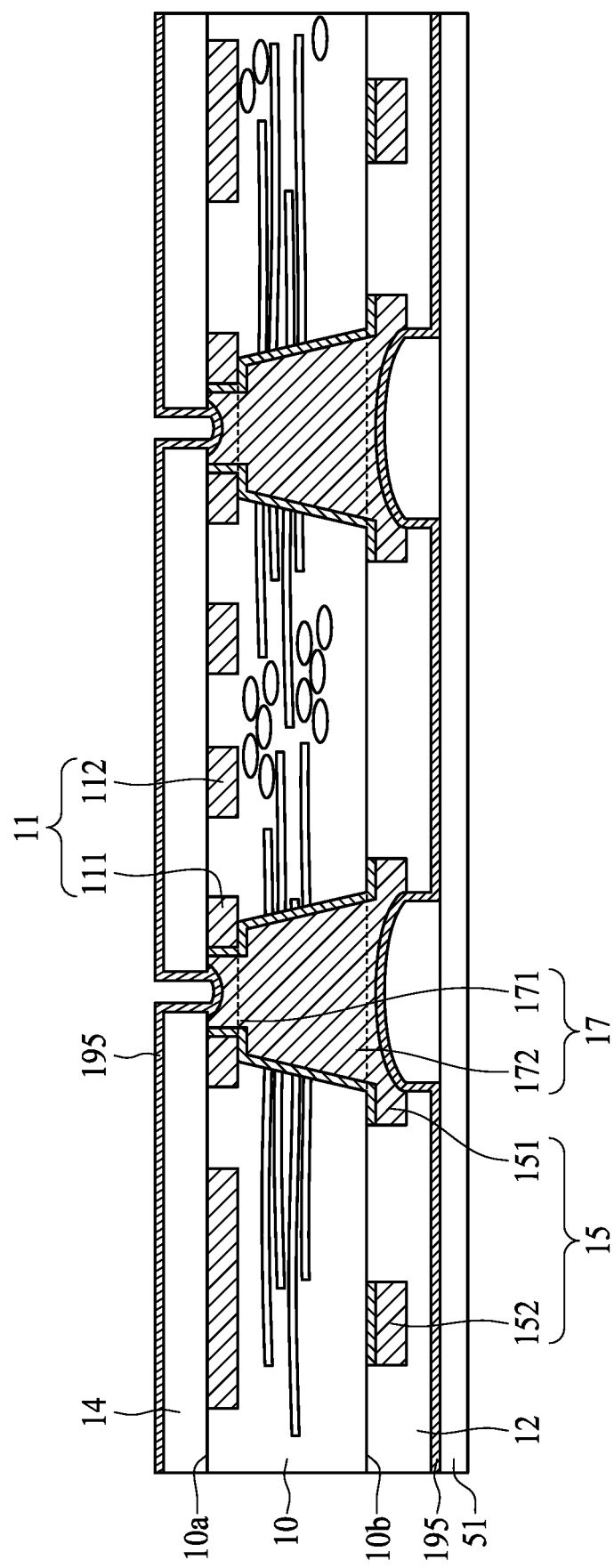
FIG. 6I illustrates a method of manufacturing a substrate according to some embodiments of the present disclosure.

Referring to FIG. 6I, a dielectric layer 51 is disposed on the first portion of the conductive layer 195 disposed on the dielectric layer 12. The dielectric layer 51 may be a dry film or a photoresist layer.

Figure 6J:
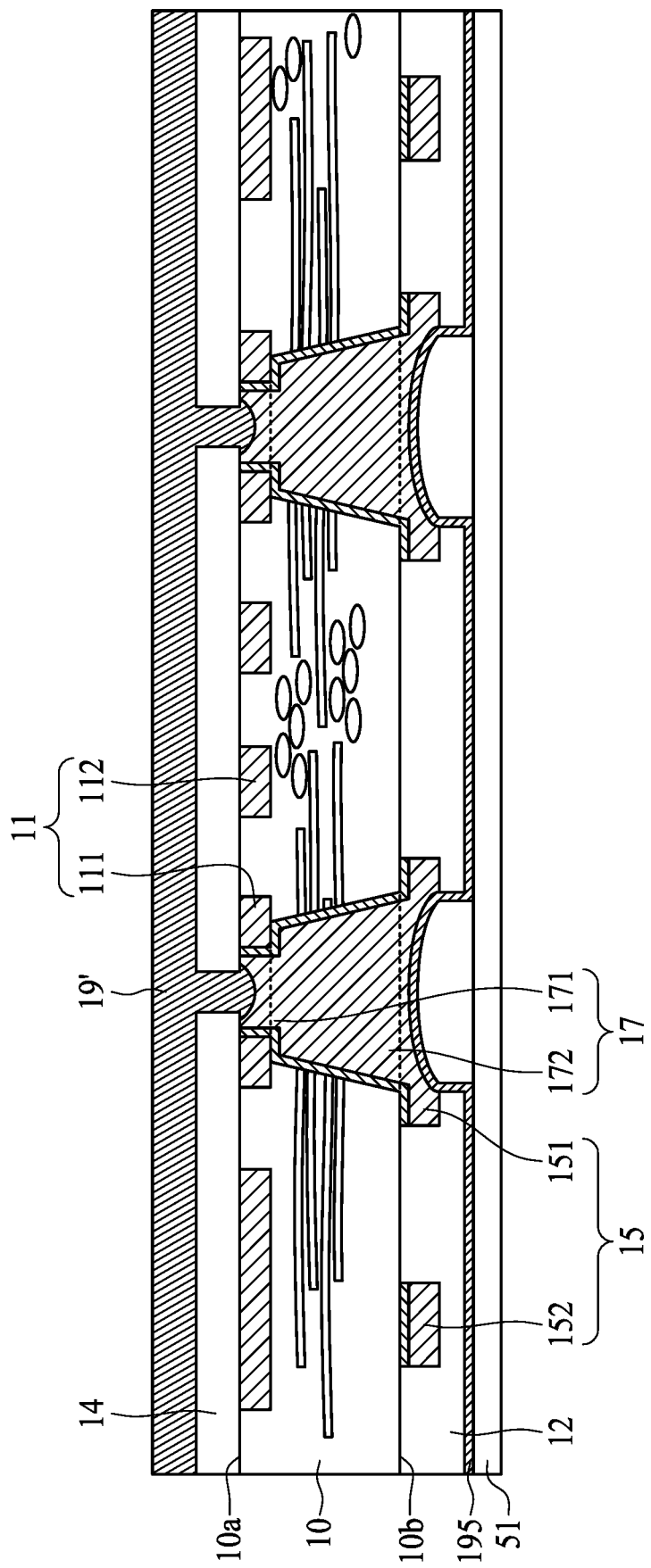
FIG. 6J illustrates a method of manufacturing a substrate according to some embodiments of the present disclosure.

Referring to FIG. 6J, a conductive layer 19' is formed on the second portion of the conductive layer 195 disposed on the dielectric layer 14 by an electroplating operation. The conductive layer 19' includes the second portion of the conductive layer 195.

Figure 6K:
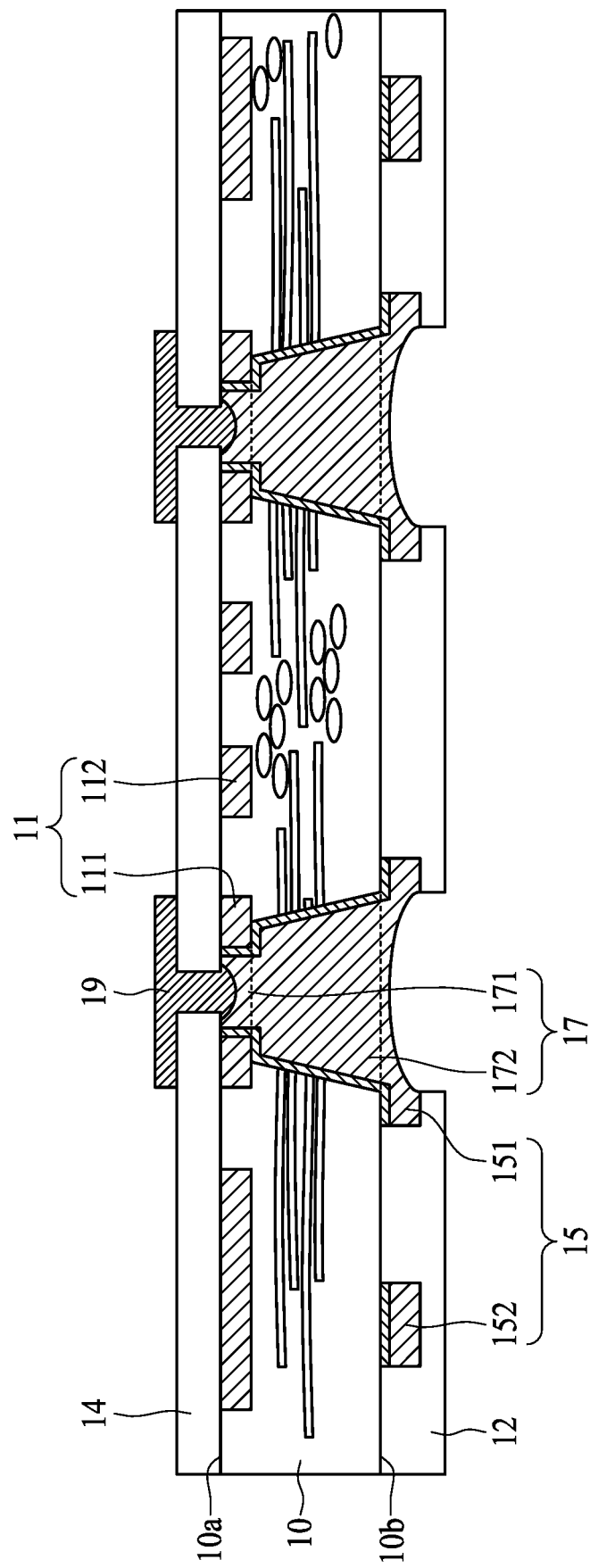
FIG. 6K illustrates a method of manufacturing a substrate according to some embodiments of the present disclosure.

Referring to FIG. 6K, the conductive layer 19' is patterned to form an external conductive pad 19. The external connection pad 19 has an anchor shape.

Figure 7:
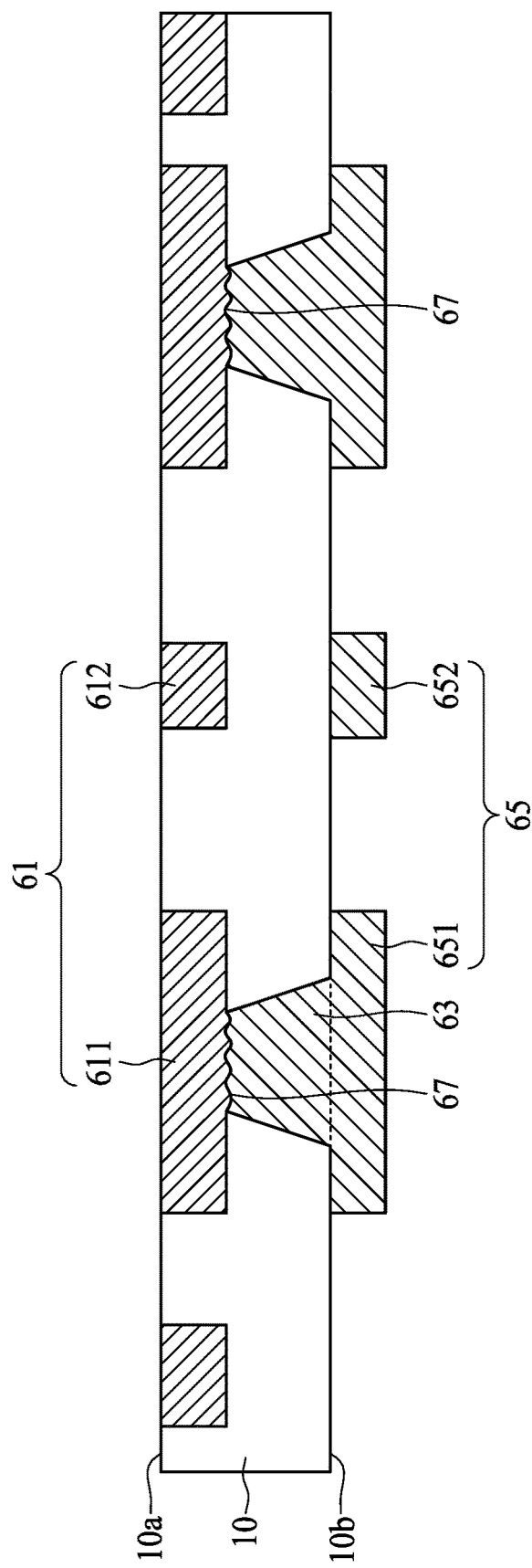
FIG. 7 illustrates a cross-sectional view of a comparative substrate according to some embodiments of the present disclosure.

FIG. 7 illustrates a cross-sectional view of a comparative substrate 5. The substrate 5 includes a dielectric layer 10, a patterned conductive layer 61, an interconnection element 63, and a conductive layer 65.

The dielectric layer 10 has a surface 10a and a surface 10b opposite to the surface 10a. The patterned conductive layer 61 includes a conductive pad 611 and a conductive trace 612 adjacent to the conductive pad 611. The patterned conductive layer 65 includes a conductive pad 651 and a conductive trace 652 adjacent to the conductive pad 651. The interconnection element 63 is disposed between the patterned conductive layer 61 and the patterned conductive layer 65.

The conductive pad 611 of the patterned conductive layer 61 is large so that it can be aligned with the interconnection element 63 during the fabrication of the substrate 5. However, such a conductive pad 611 may decrease an available space on the surface 10a of the dielectric layer 10. Also, since the interconnection element 63 is two-dimensionally in contact the conductive pad 611, a crack may readily form at a position/interface 67 between the conductive pad 611 and the interconnection element 63.

Figure 8A:
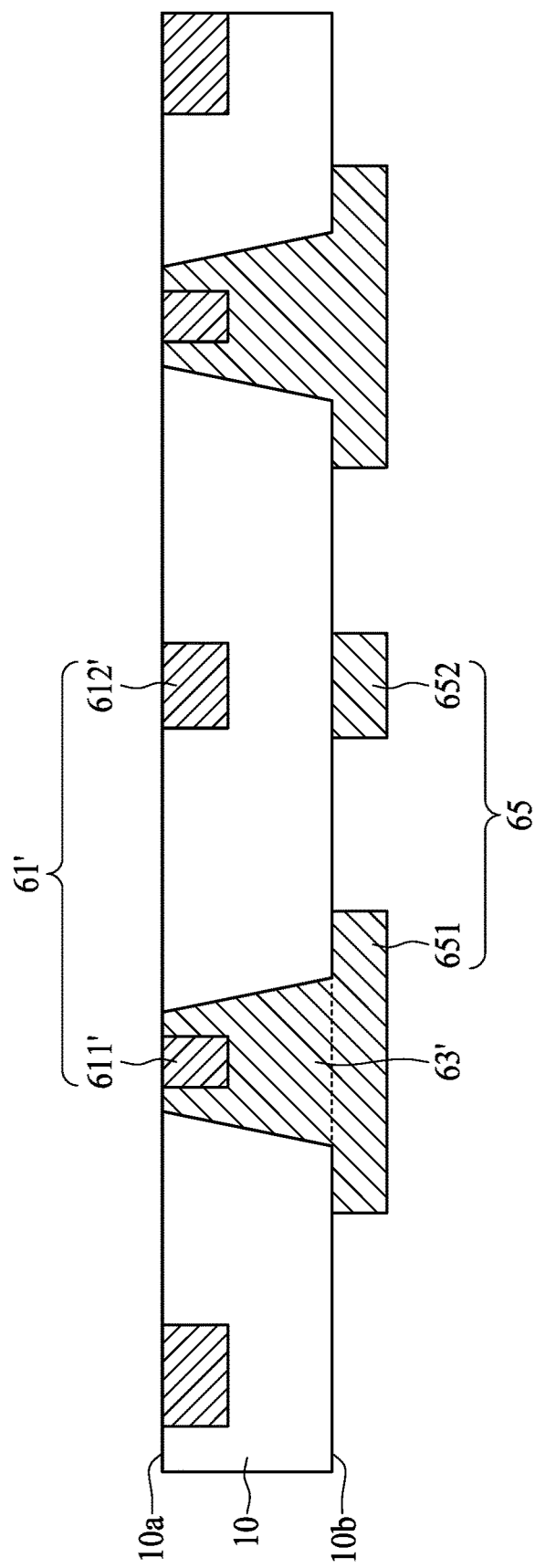
FIG. 8A illustrates a cross-sectional view of a comparative substrate according to some embodiments of the present disclosure.

FIG. 8A is a cross-sectional view of a comparative substrate 6. The substrate 6 includes a dielectric layer 10, a patterned conductive layer 61', an interconnection element 63', and a conductive layer 65.

The dielectric layer 10 has a surface 10a and a surface 10b opposite to the surface 10a. The patterned conductive layer 61' includes a conductive pad 611' and a conductive trace 612' adjacent to the conductive pad 611'. The patterned conductive layer 65 includes a conductive pad 651 and a conductive trace 652 adjacent to the conductive pad 651. The interconnection element 63' is disposed between the surface 10a and the surface 10b of the dielectric layer 10.

The interconnection element 63' is exposed from the surface 10a of the dielectric layer 10, and a lateral width/dimension of the interconnection element 63' at the surface 10a (shown by a circle 63' in FIG. 8B) is greater than a lateral width/dimension of the conductive pad 611' at the surface 10a. In this comparative example, the conductive pad 611' is surrounded by the interconnection element 63'. However, an available space on the surface 10a of the dielectric layer 10 (e.g., space for trace 612' routing) may be small due to the exposure of the interconnection element 63' at the surface 10a of the dielectric layer 10.

Figure 8B:
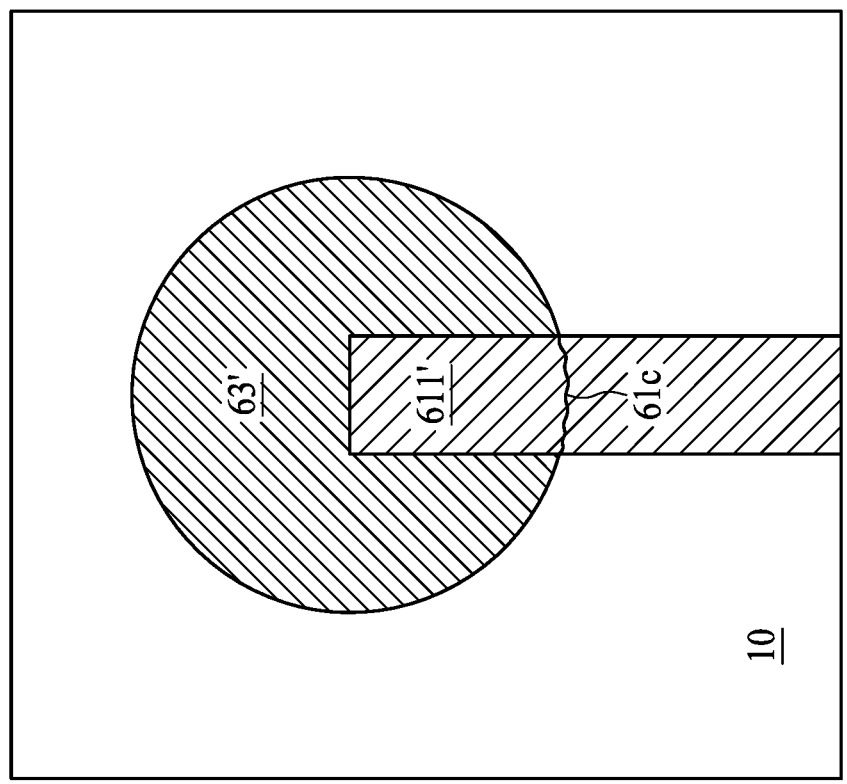
FIG. 8B illustrates a top view of a comparative substrate according to some embodiments of the present disclosure.

FIG. 8B is a top view of a comparative substrate 6 according to some embodiments of the present disclosure. A position 61c at which the conductive pad 611' protrudes in to the interconnection element 63' from the dielectric layer 10 may have become cracked because a high stress may be focused at the position 61c.

Additionally, the interconnection element 63' may be irregularly shaped by a laser drilling operation. The irregular shape of the interconnection element 63' may cause electrical disconnection between the substrate 6 and a semiconductor device disposed on the substrate 6.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A substrate for bonding a semiconductor device, comprising:
   a dielectric layer having a first surface and a second surface opposite to the first surface;
   a first patterned conductive layer adjacent to the first surface of the dielectric layer and comprising an interconnection structure, a surface of the interconnection structure adjacent to the first surface of the dielectric layer being exposed to air;
   a second patterned conductive layer adjacent to the second surface of the dielectric layer;
   an interconnection element electrically connecting the first patterned conductive layer to the second patterned conductive layer and surrounded by the interconnection structure;
   a second dielectric layer disposed on the first patterned conductive layer and defining an opening, wherein the interconnection element is exposed by the opening of the second dielectric layer; and
   a conductive pad disposed on the second dielectric layer and extending into the interconnection element, a portion of the conductive pad being laterally surrounded by the interconnection structure,
   wherein the interconnection element and at least a portion of the second patterned conductive layer are formed as a monolithic structure, and
   wherein a surface of the interconnection element is a bonding surface for the semiconductor device.

2. The substrate of claim 1, wherein the interconnection element comprises a third patterned conductive layer in contact with the dielectric layer and the interconnection structure of the first patterned conductive layer.

3. The substrate of claim 2, wherein the third patterned conductive layer is a seed layer.

4. The substrate of claim 1, wherein the first patterned conductive layer is embedded in the dielectric layer, and the first surface of the dielectric layer and a surface of the first patterned conductive layer are substantially coplanar.

5. The substrate of claim 4, wherein the interconnection element comprises a first portion and a second portion, wherein the first portion of the interconnection element comprises a cylindrical structure and the second portion of the interconnection element comprises a conic structure, and wherein a width of the first portion of the interconnection element is less than a width of the second portion of the interconnection element.

6. The substrate of claim 5, wherein the first surface of the dielectric layer and a surface of the first portion of the interconnection element are substantially coplanar.

7. The substrate of claim 5, wherein a surface of the first portion of the interconnection element is recessed from the first surface of the dielectric layer.

8. The substrate of claim 5, wherein a width of the conductive pad is greater than or equal to a width of the second portion of the interconnection element.

9. The substrate of claim 1, wherein the interconnection element comprises a first portion and a second portion, and wherein the second portion of the interconnection element has an upper surface and a lower surface, and the second portion of the interconnection element tapers from the lower surface to the upper surface.

10. The substrate of claim 9, wherein the second surface of the dielectric layer and the lower surface of the second portion of the interconnection element are substantially coplanar.

11. The substrate of claim 1, wherein the surface of the interconnection element exposed by the second dielectric layer includes a portion having a curved shape.

12. The substrate of claim 1, wherein a width of the surface of the interconnection element is greater than a width of the opening of the second dielectric layer.

13. The substrate of claim 1, wherein the conductive pad has an anchor shape.

14. The substrate of claim 1, wherein the interconnection structure of the first patterned conductive layer is a conductive pad.

15. The substrate of claim 14, wherein the first patterned conductive layer further comprises a first conductive trace adjacent to the conductive pad.

16. The substrate of claim 15, wherein the second patterned conductive layer further comprises a second conductive trace, and wherein a width of the first conductive trace of the first patterned conductive layer is less than a width of the second conductive trace of the second patterned conductive layer.

17. The substrate of claim 14, wherein a width of the conductive pad is less than or equal to a maximum width of the interconnection element.

* * * * *